United States Patent
Liaw

(10) Patent No.: US 11,659,703 B2
(45) Date of Patent: May 23, 2023

(54) INTEGRATED CIRCUIT WITH EMBEDDED HIGH-DENSITY AND HIGH-CURRENT SRAM MACROS

(71) Applicant: Taiwan Semiconductor Manufacturing Company, Ltd., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 191 days.

(21) Appl. No.: 17/187,068

(22) Filed: Feb. 26, 2021

(65) Prior Publication Data
US 2022/0278110 A1 Sep. 1, 2022

(51) Int. Cl.
*H01L 27/11* (2006.01)
*H01L 23/528* (2006.01)
(Continued)

(52) U.S. Cl.
CPC ........ *H01L 27/1108* (2013.01); *G11C 11/419* (2013.01); *H01L 21/28088* (2013.01); *H01L 21/823814* (2013.01); *H01L 21/823842* (2013.01); *H01L 21/823871* (2013.01); *H01L 23/5286* (2013.01); *H01L 27/1104* (2013.01); *H01L 27/1116* (2013.01); *H01L 29/0673* (2013.01); *H01L 29/0847* (2013.01); *H01L 29/41733* (2013.01); *H01L 29/41791* (2013.01);
(Continued)

(58) Field of Classification Search
CPC .......... H01L 27/1108; H01L 21/28088; H01L 21/823814; H01L 21/823842; H01L 21/823871; H01L 23/5286; H01L 27/1104; H01L 27/1116; H01L 29/0673; H01L 29/0847; H01L 29/41733; H01L 29/41791; H01L 29/42392; H01L 29/4908; H01L 29/4966; H01L 29/66545; H01L 29/7851; H01L 29/78618; H01L 29/78696; H01L 29/66977; H01L 29/7848; H01L 29/775; H01L 29/785; G11C 11/419; G11C 11/412; G11C 5/025
USPC ....................................... 257/351
See application file for complete search history.

(56) References Cited

U.S. PATENT DOCUMENTS 7,269,056 B1 9/2007 Liaw
8,947,902 B2 2/2015 Liaw
(Continued)

*Primary Examiner* — Tong-Ho Kim
(74) *Attorney, Agent, or Firm* — Haynes and Boone, LLP

(57) ABSTRACT

A semiconductor structure includes a substrate and first SRAM cells and second SRAM cells. Each first SRAM cell includes two first p-type FinFET and four first n-type FinFET. Each first p-type and n-type FinFET includes a channel in a single semiconductor fin. The first SRAM cells are arranged with a first X-pitch and a first Y-pitch. Each second SRAM cell includes two second p-type FinFET and four second n-type FinFET. Each second p-type FinFET includes a channel in a single semiconductor fin. Each second n-type FinFET includes a channel in multiple semiconductor fins. The second SRAM cells are arranged with a second X-pitch and a second Y-pitch. The source/drain regions of the first p-type FinFET have a higher boron dopant concentration than the source/drain regions of the second p-type FinFET. A ratio of the second X-pitch to the first X-pitch is within a range of 1.1 to 1.5.

20 Claims, 33 Drawing Sheets

(51) Int. Cl.
*H01L 29/78* (2006.01)
*H01L 29/08* (2006.01)
*H01L 29/49* (2006.01)
*H01L 29/06* (2006.01)
*H01L 29/423* (2006.01)
*H01L 29/417* (2006.01)
*H01L 29/786* (2006.01)
*H01L 29/66* (2006.01)
*H01L 21/28* (2006.01)
*H01L 21/8238* (2006.01)
*G11C 11/419* (2006.01)

(52) U.S. Cl.
CPC .... *H01L 29/42392* (2013.01); *H01L 29/4908* (2013.01); *H01L 29/4966* (2013.01); *H01L 29/66545* (2013.01); *H01L 29/7851* (2013.01); *H01L 29/78618* (2013.01); *H01L 29/78696* (2013.01)

(56) References Cited

U.S. PATENT DOCUMENTS

| | | | |
|---|---|---|---|
| 9,218,872 B1 * | 12/2015 | Liaw | ............... G11C 11/419 |
| 9,349,436 B2 | 5/2016 | Liaw | |
| 9,576,644 B2 | 2/2017 | Liaw | |
| 9,935,001 B2 | 4/2018 | Liaw | |
| 10,276,581 B1 * | 4/2019 | Liaw | ............... H01L 21/82385 |
| 10,381,070 B2 | 8/2019 | Liaw | |
| 2021/0202498 A1 * | 7/2021 | Liaw | ............... B82Y 10/00 |

\* cited by examiner

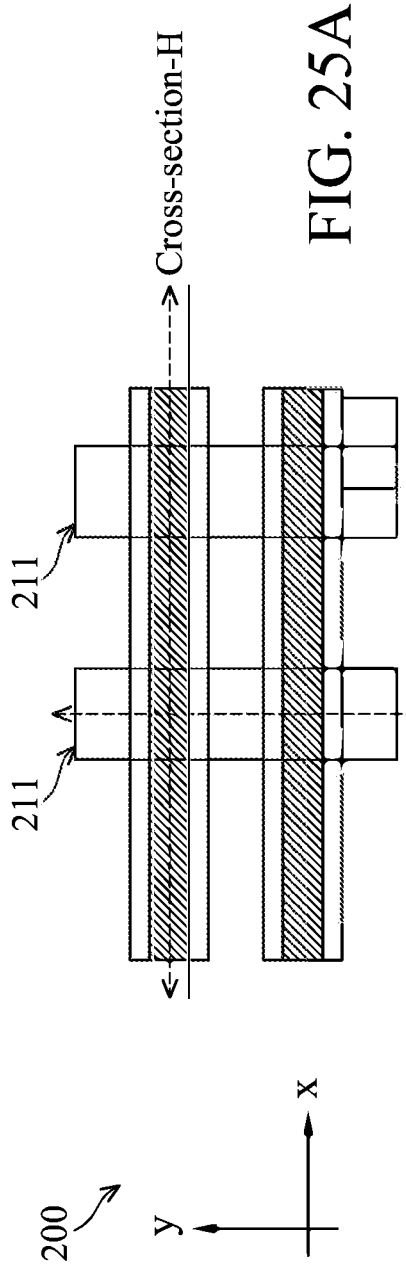
FIG. 25A
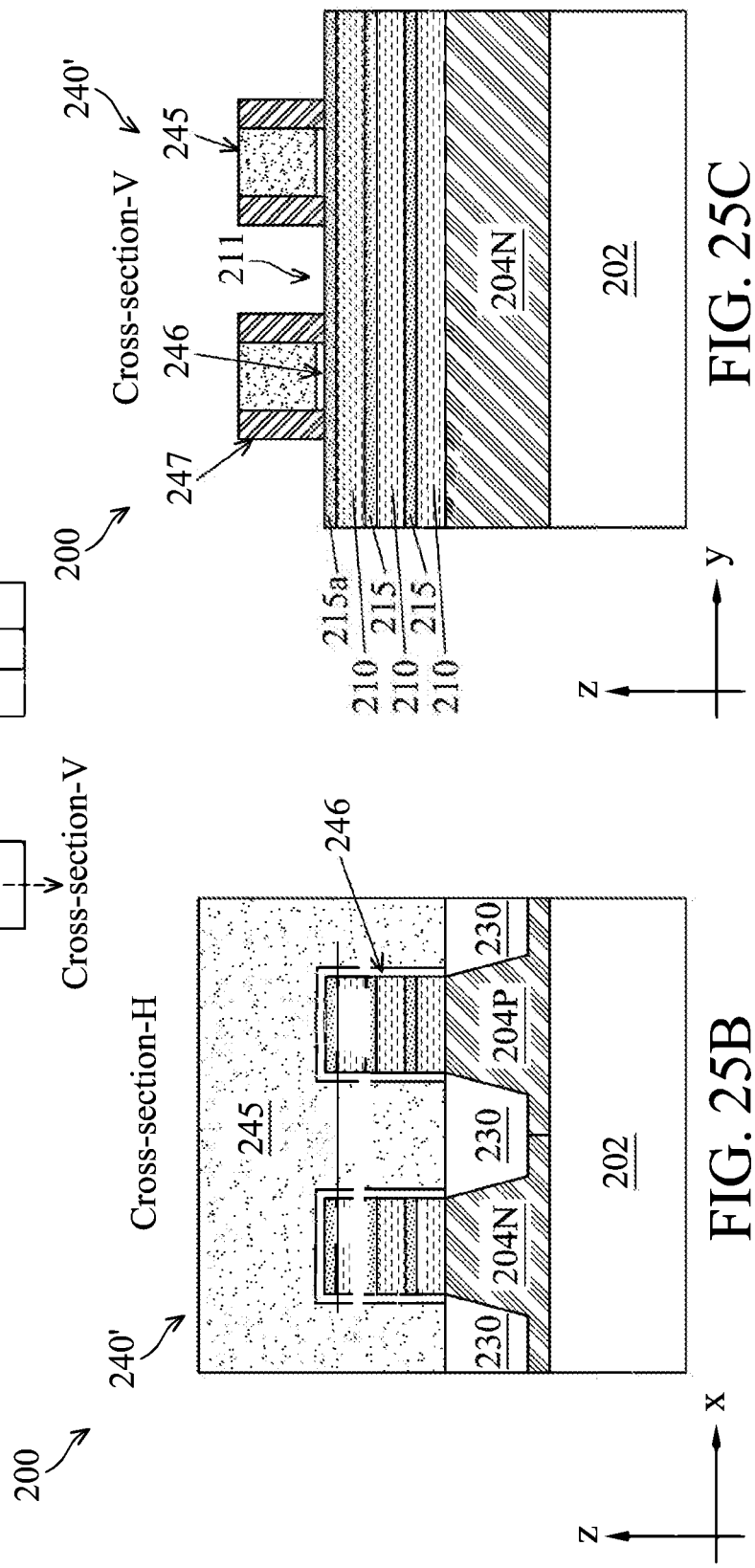
FIG. 25C
FIG. 25B

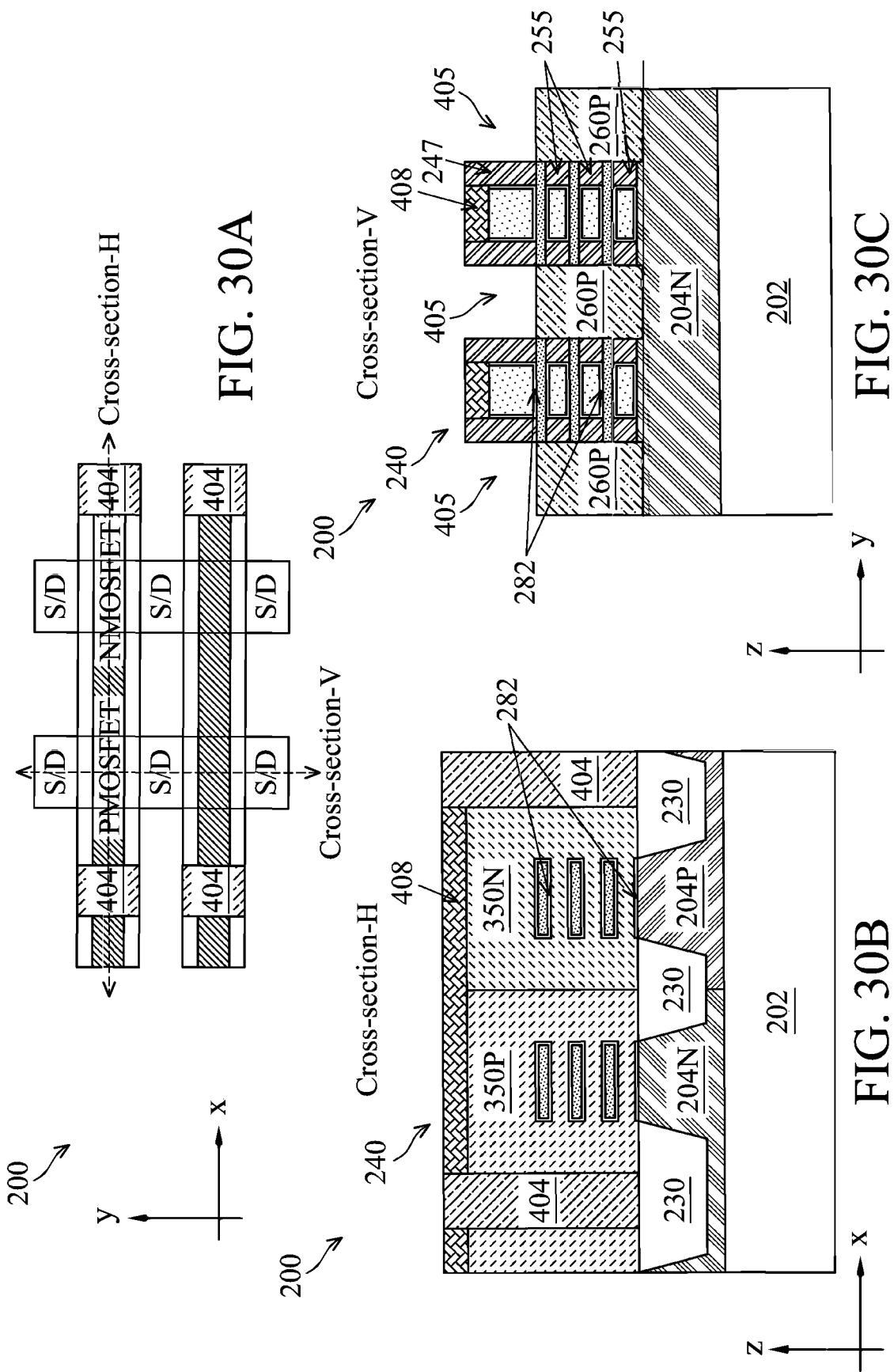

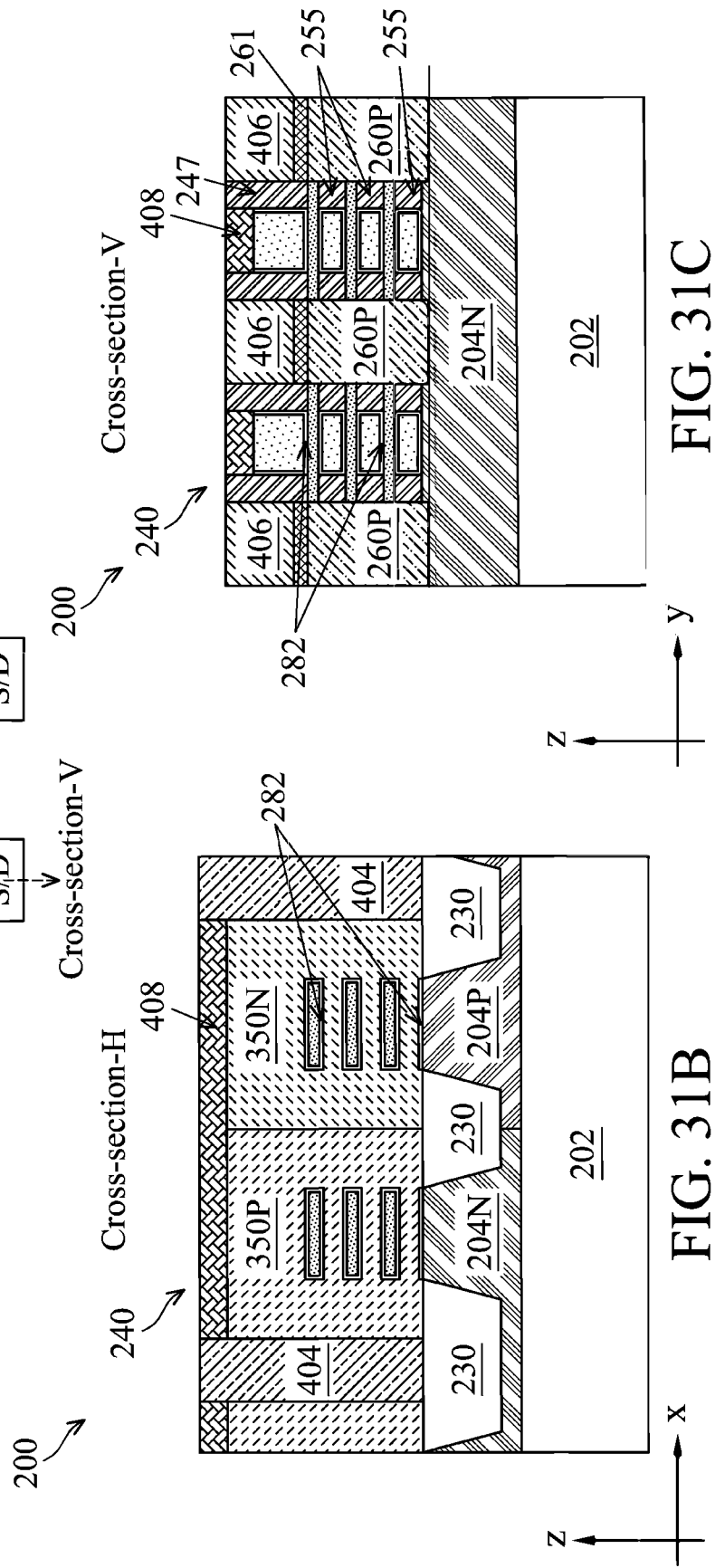
FIG. 31A
FIG. 31B
FIG. 31C

INTEGRATED CIRCUIT WITH EMBEDDED HIGH-DENSITY AND HIGH-CURRENT SRAM MACROS

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. One such advance is desired in embedded memory design. For example, how to provide both high-density memory cells and high-current memory cells to meet cache memory requirements, such as L1/L2/L3 cache memories, in advanced process nodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 25A, 26A, 27A, 28A, 29A, 30A, and 31A are diagrammatic top views of an IC device, in portion, at various fabrication stages (such as those associated with the method in FIGS. 24A-B) according to various aspects of the present disclosure.

FIGS. 25B, 26B, 27B, 28B, 29B, 30B, and 31B are diagrammatic cross-sectional views of an IC device, in portion, along the "Cross-section-H" line in FIGS. 25A, 26A, 27A, 28A, 29A, 30A, and 31A, respectively, at various fabrication stages (such as those associated with the method in FIGS. 24A-B) according to various aspects of the present disclosure.

FIGS. 25C, 26C, 27C, 28C, 29C, 30C, and 31C are diagrammatic cross-sectional views of an IC device, in portion, along the "Cross-section-V" line in FIGS. 25A, 26A, 27A, 28A, 29A, 30A, and 31A, respectively, at various fabrication stages (such as those associated with the method in FIGS. 24A-B) according to various aspects of the present disclosure.

DETAILED DESCRIPTION

Figure 1B:
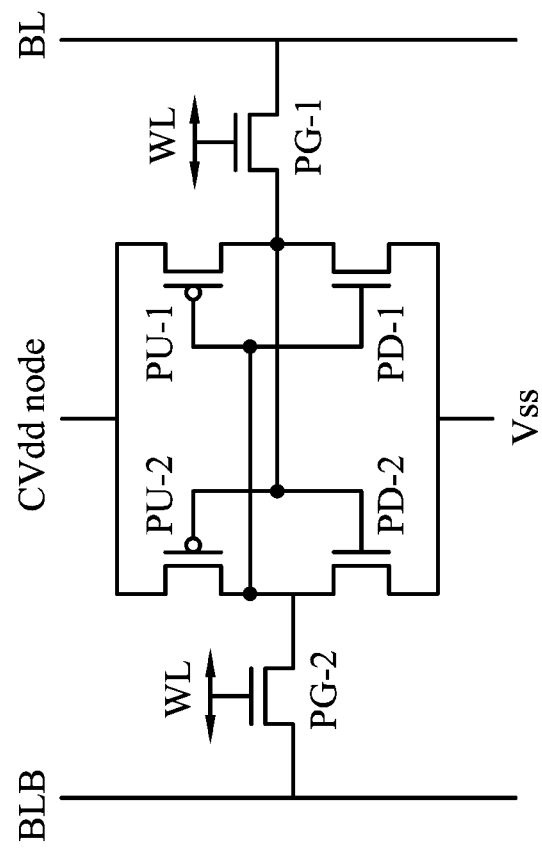
FIG. 1B shows a schematic view of a six-transistor (6T) single-port (SP) SRAM cell, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to semiconductor structures and fabrication processes thereof, and more particularly to integrated circuits (IC) having both high-density (HD) memory cells and high-current (HC) (or high-speed (HS)) memory cells implemented with FinFET transistors or gate-all-around (GAA) transistors. GAA transistors refer to transistors having gate electrodes surrounding transistor channels, such as vertically-stacked gate-all-around horizontal nanowire or nanosheet MOSFET devices. An objective of the present disclosure is to provide new designs and new layouts that use FinFET transistors and GAA transistors (separately) to achieve HD memory and HC memory in the same IC. For example, the HD memory uses narrower channel regions to serve non-speed critical circuits and is designed with high alpha ratio for cell stability improvement. The HD memory thus has both lower leakage and power consumption advantages as well as density improvement. The HC memory uses wider channel width for high speed application and is provided with low alpha ratio for cell write margin improvements. The pull-up transistors (either FinFET transistors or GAA transistors) in HD memory are provided with higher dopant concentration than the pull-up transistors (either FinFET transistors or GAA transistors) in HC memory to increase the cell stability (for example, HD memory cells have improved ability to store and maintain logic high state). Further, the HD memory are provided with write-assist circuitry to improve Vcc_min and write margin requirements, where Vcc_min refers to the minimum operation voltage for an SRAM array to read and write safely under the required frequency constraint. The HC memory are not provided with write-assist circuitry because it has sufficient write margin. Also, the bit lines (and/or other conductors) for the HC memory are provided with greater widths than the counterparts for the HD memory to further increase the operating speed of the HC memory. Those of ordinary skill in the art should appreciate that they may readily use the present disclosure as a basis for designing or modifying other structures for carrying out the same purposes and/or achieving the same advantages of the embodiments introduced herein.

Figure 1A:
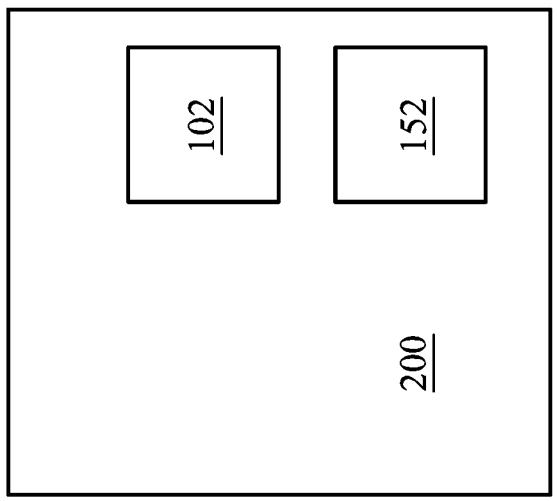
FIG. 1A is a simplified block diagram of an integrated circuit (IC) with a high-density memory macro and a high-current memory macro, according to various aspects of the present disclosure.

FIG. 1A shows a semiconductor device (or IC) 200. The semiconductor device 200 can be, e.g., a microprocessor, an application specific integrated circuit (ASIC), a field programmable gate array (FPGA), a digital signal processor (DSP), or a portion thereof, that includes various passive and active microelectronic devices such as resistors, capacitors, inductors, diodes, p-type field effect transistors (PFETs), n-type field effect transistors (NFETs), FinFET, GAA transistors (such as nanosheet FETs or nanowire FETs), other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The exact functionality of the semiconductor device 200 is not a limitation to the provided subject matter.

In the present embodiment, the semiconductor device 200 includes a high-density (HD) SRAM macro 102 (or simply HD SRAM 102) and a high-current (HC) SRAM macro 152 (or simply HC SRAM 152). Each of the SRAM macros 102 and 152 includes many SRAM cells that may be arranged as a memory array (or an array of memory cells), and further includes peripheral logic circuits. The memory cells store data. The peripheral logic circuits perform address decoding and read/write operations from/to the memory cells. The HD SRAM 102 further includes write-assist circuits, which will be further described later. The HC SRAM 152 does not include write-assist circuits because the memory cells therein have sufficient noise margin in both read and write operations. In the present embodiment, the HD SRAM 102 includes an array of single port (SP) six-transistor (6T) SRAM cells 104, and the HC SRAM 152 includes an array of SP 6T SRAM cells 154. The SP 6T SRAM cells 104 and the SP 6T SRAM cells 154 have the same schematic representation, which is shown in FIG. 1B, but have different layout designs and different physical structures, which will be discussed later. In various embodiments, the SRAM macros 102 and 152 may include other types of memory cells, such as dual-port memory cells or memory cells having more than six transistors.

Referring to FIG. 1B, the 6T SP SRAM cell 104 (and 154) includes two PMOS transistors as pull-up transistors PU-1 and PU-2; two NMOS transistors as pull-down transistors PD-1 and PD-2; and two NMOS transistors as pass-gate (or access) transistors PG-1 and PG-2. The PU-1 and PD-1 are coupled to form an inverter. The PU-2 and PD-2 are coupled to form another inverter. The two inverters are cross-coupled to form data storage nodes. The PG-1 and PG-2 are coupled to the data storage nodes for writing thereto and reading therefrom. FIG. 1B further shows word line (WL), bit line (BL), and bit line bar (BLB or inverse bit line) for accessing the data storage nodes of the SRAM cell 104 (and 154), and positive power supply CVdd and negative power supply (or ground) Vss. In an embodiment, each of the PU-1, PU-2, PD-1, PD-2, PG-1, and PG-2 transistors are FinFET transistors. In another embodiment, each of the PU-1, PU-2, PD-1, PD-2, PG-1, and PG-2 transistors are GAA transistors.

Figure 2:
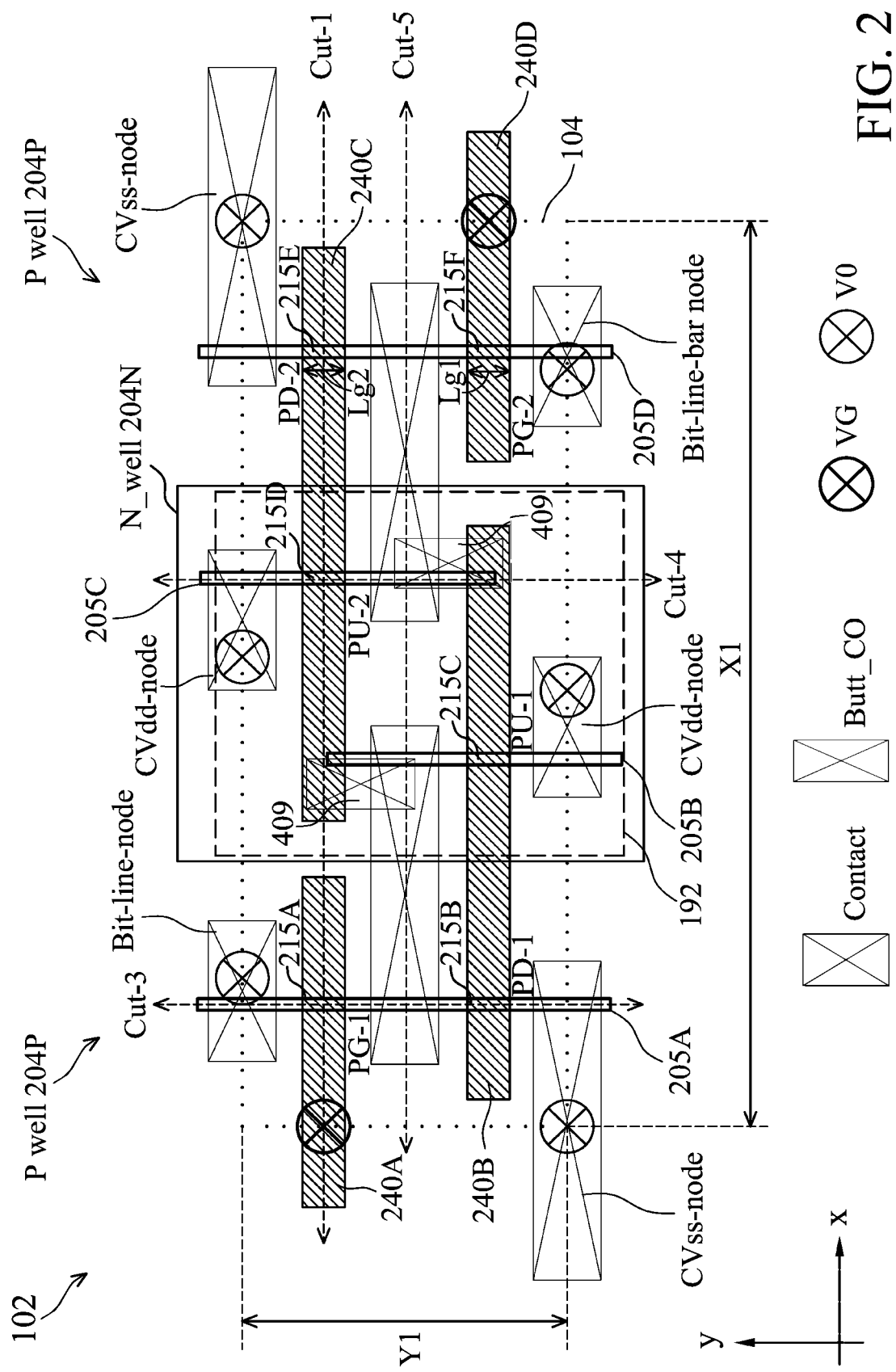
FIGS. 2 and 10 show portions of a layout of the SRAM cell of FIG. 1B, in accordance with an embodiment where the SRAM cell is a high-density memory cell and the transistors are FinFET.

FIG. 2 shows a layout of the HD SRAM macro 102, particularly, a layout of certain layers (or features) of the HD SRAM cell 104. Referring to FIG. 2, the HD SRAM cell 104 occupies an area indicated by the dotted rectangular box with a length X1 along the "x" direction and a width Y1 along the "y" direction. The SRAM macro 102 includes an array of such SRAM cells 104 arranged in rows along the "x" direction and in columns along the "y" direction. In that regard, the length X1 is also the pitch of the array of memory cells 104 along the "x" direction, and the width Y1 is also the pitch of the array of memory cells 104 along the "y" direction.

The HD SRAM cell 104 includes active regions 205 (including 205A, 205B, 205C, and 205D) that are oriented lengthwise along the "y" direction, and gate stacks 240 (including 240A, 240B, 240C and 240D) that are oriented lengthwise along the "x" direction perpendicular to the "y" direction. The active regions 205B and 205C are disposed over an n-type well (or N Well) 204N. The active regions 205A and 205D are disposed over p-type wells (or P Wells) 204P that are on both sides of the N well 204N along the "x" direction. The gate stacks 240 engage the channel regions of the respective active regions 205 to form transistors. In that regard, the gate stack 240A engages the channel region 215A of the active region 205A to form an NMOSFET as the pass-gate transistor PG-1; the gate stack 240B engages the channel region 215B of the active region 205A to form an NMOSFET as the pull-down transistor PD-1 and engages the channel region 215C of the active region 205B to form a PMOSFET as the pull-up transistor PU-1; the gate stack 240C engages the channel region 215E of the active region 205D to form an NMOSFET as the pull-down transistor PD-2 and engages the channel region 215D of the active region 205C to form a PMOSFET as the pull-up transistor PU-2; and the gate stack 240D engages the channel region 215F of the active region 205D to form an NMOSFET as the pass-gate transistor PG-2. In the present embodiment, each of the channel regions 215A-F is in the shape of a single fin (single semiconductor fin) and each of the transistors PU-1, PU-2, PD-1, PD-2, PG-1, and PG-2 is a FinFET transistor formed on a single semiconductor fin.

The HD SRAM cell 104 further includes source/drain contacts disposed over the source/drain regions of the active regions 205 (the source/drain regions are disposed on both sides of the respective channel region), a butted contact (Butt_Co) 409 disposed over and connecting the active region 205B and the gate stack 240C, another butted contact 409 disposed over and connecting the active region 205C and the gate stack 240B, source/drain contact vias ("V0") disposed over and connecting to the source/drain contacts, and two gate vias ("VG") disposed over and connecting to the gate stacks 240A and 240D respectively. FIG. 2 further illustrates the circuit nodes CVss-node, CVdd-node, Bit-line-node, and Bit-line-bar-node (or BLB node), corresponding to the circuit nodes Vss, CVdd, BL, and BLB in FIG. 1B. The bit-line-bar is also referred to as the inverse bit line or the BLB.

FIGS. 3, 4, 5, and 6 illustrate cross-sectional view of the SRAM cell 104 along the "Cut-1," "Cut-3," "Cut-4," and "Cut-5" lines in FIG. 2, respectively. Referring to FIGS. 2, 3, 4, 5, and 6 collectively, in the depicted embodiment, the active regions 205 include fin-shaped transistor channels 215 (or semiconductor fins 215) in the respective channel regions, and source/drain feature 260 (including 260P for PMOSFET and 260N for NMOSFET) in the source/drain regions that sandwich the channel regions. Particularly, each of the transistor channels 215 (215A, 215B, 215C, 215D, 215E, and 215F) is a single semiconductor fin so as to minimize the footprint of the HD SRAM cell 104. In that regards, the active regions 205A, 205B, 205C, and 205D include channels 215A-B, 215C, 215D, and 215E-F respectively. The transistor channels 215A-F are oriented lengthwise along the "y" direction (i.e., along a direction from source to drain), and widthwise along the "x" direction. The length of the channels 215 are also commonly referred to as gate length (or Lg). For example, FIG. 2 illustrates that the channel 215F has a gate length of Lg1 and the channel 215E has a gate length of Lg2. In the present embodiment, the gate lengths Lg1 and Lg2 are about the same, which are defined by the width of the gate stacks 240D and 240C respectively. Further, the lengths of the channels 215A, 215B, 215C, 215D, 215E, and 215F are about the same in the present embodiment. The widths of the active regions 205A through 205D, particularly the widths of the channels 215A through 215F, are about the same in the depicted embodiment.

Figure 3:
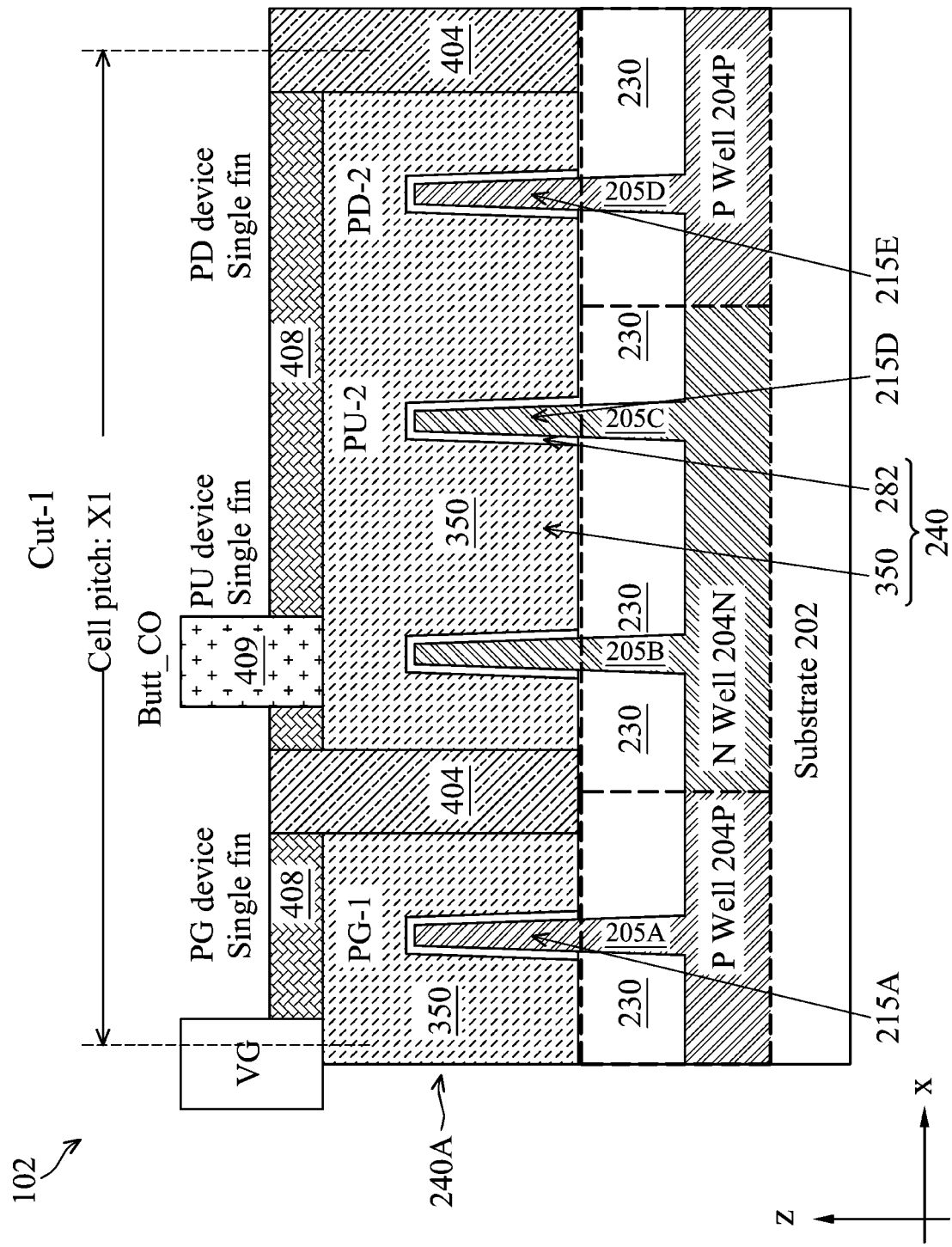
FIGS. 3, 4, 5, and 6 show cross-sectional views of the SRAM cell of FIG. 2, in portion, along the "Cut-1" line, the "Cut-3" line, the "Cut-4" line, and the "Cut-5" line in FIG. 2, respectively, in accordance with some embodiments of the present disclosure.

Referring to FIG. 3, the device 200 includes a substrate 202, over which the various features including the wells 204P/N, the gate stacks 240, and the active regions 205 are formed. In an embodiment, substrate 202 includes silicon, such as a silicon wafer. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The wells 204P and 204N are formed in or on the substrate 202. In the present embodiment, the wells 204P are p-type doped regions configured for n-type transistors, and the wells 204N are n-type doped regions configured for p-type transistors. The wells 204N are doped with n-type dopants, such as phosphorus, arsenic, other n-type dopant, or combinations thereof. The wells 204P are doped with p-type dopants, such as boron, indium, other p-type dopant, or combinations thereof. In some implementations, substrate 202 includes doped regions formed with a combination of p-type dopants and n-type dopants. The various wells can be formed directly on and/or in substrate 202. An ion implantation process, a diffusion process, and/or other suitable doping process can be performed to form the various wells.

Figure 5:
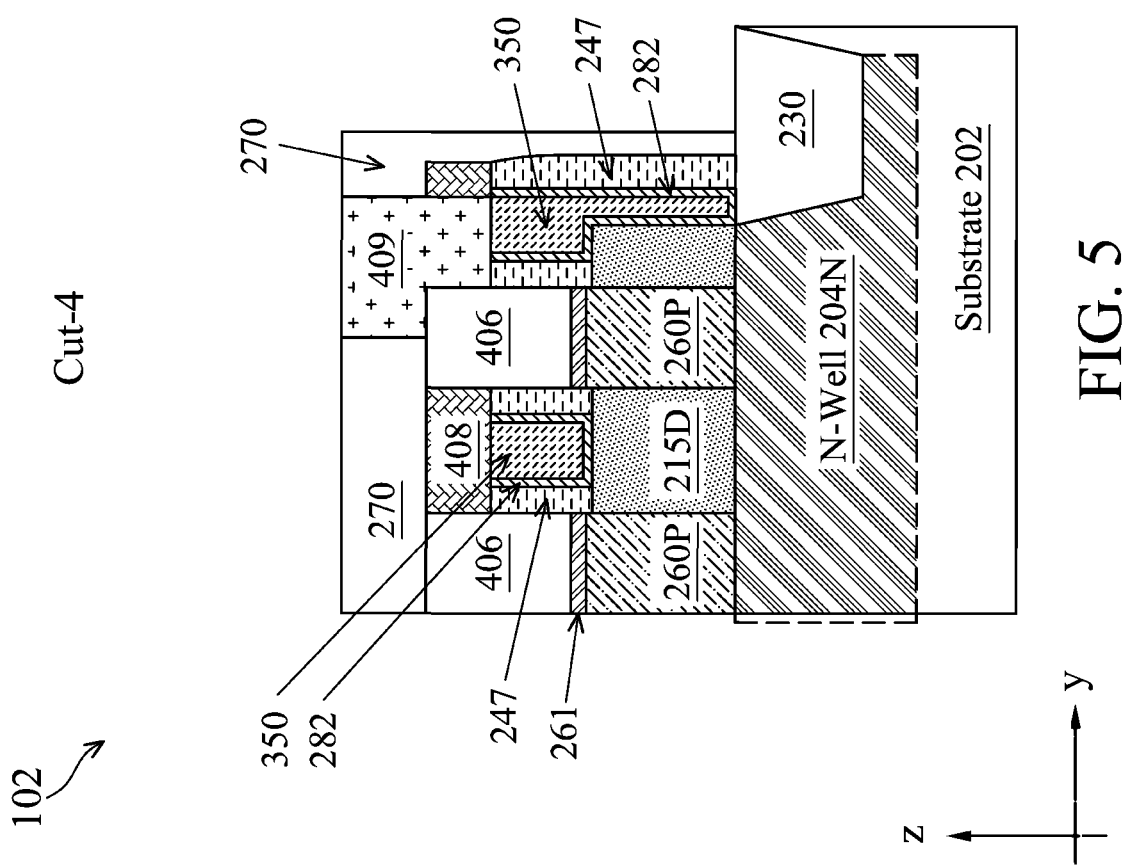
Figure 6:
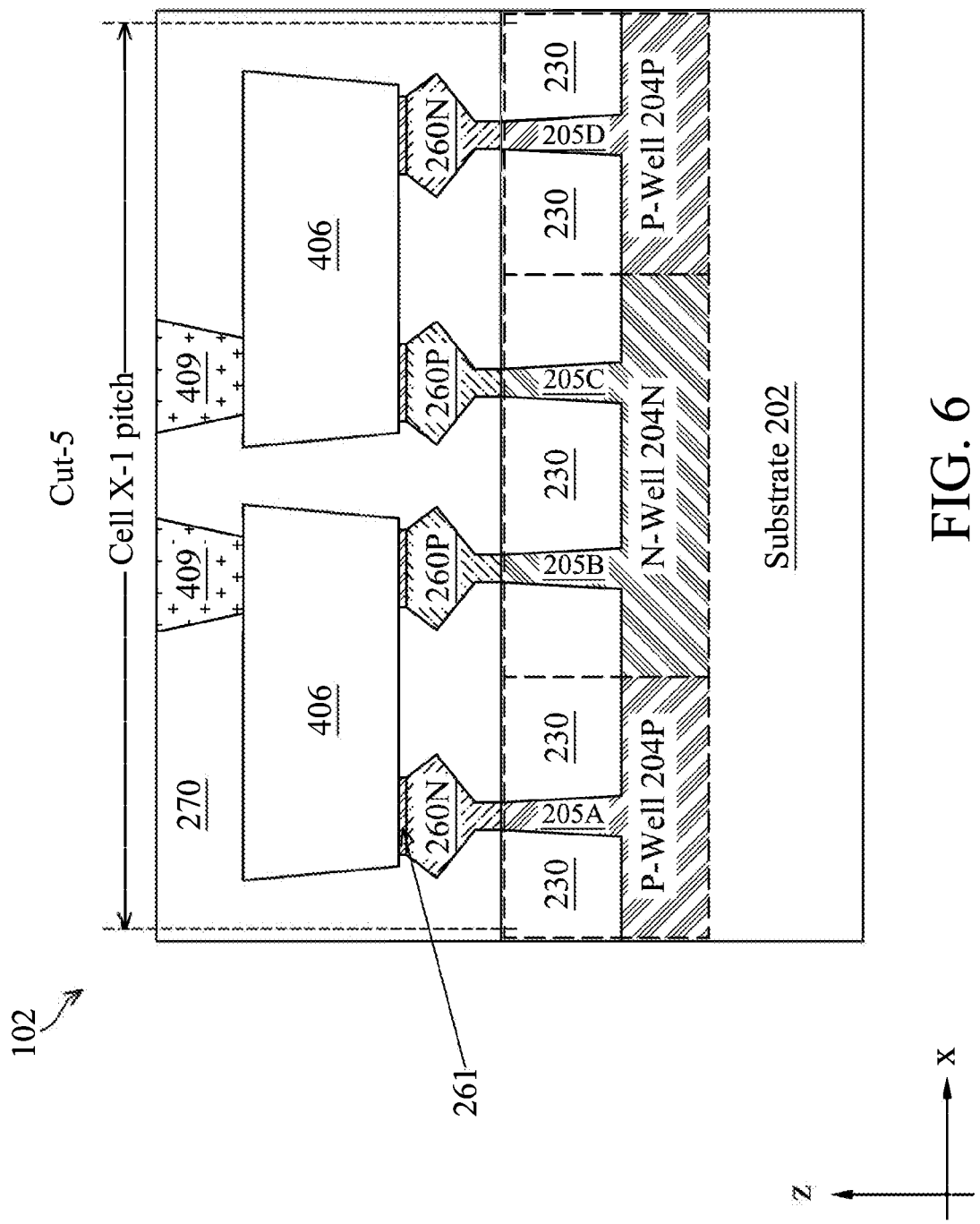

As shown in FIGS. 3, 5, and 6, the device 200 further includes an isolation structure (or isolation features) 230 over the substrate 202 and isolating the adjacent active regions 205. The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 may include different structures, such as shallow trench isolation (STI) structures, deep trench isolation (DTI) structures, and/or local oxidation of silicon (LOCOS) structures.

Figure 4:
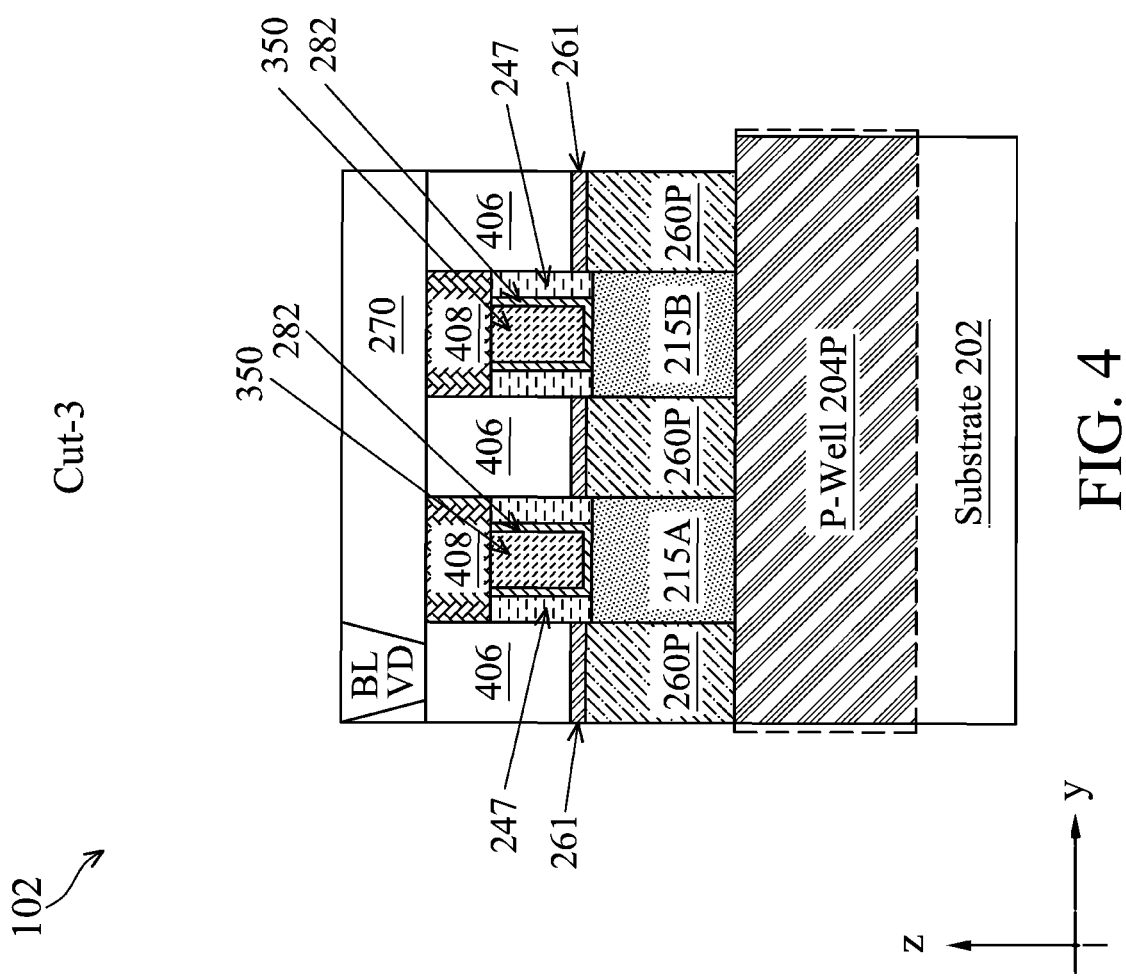

As shown in FIGS. 3, 4, and 5, the channel layers 215 are disposed over the wells 204P and 204N and connecting a pair of source/drain features 260. Particularly, each of the channel layers 215A and 215B (as well as the channel layers 215E and 215F) connects a pair of n-type source/drain features 260N, and the channel layer 215D (as well as the channel layer 215C) connects a pair of p-type source/drain features 260P. In an embodiment, the channel layers 215A, 215B, 215E, and 215F (for NMOS transistors) include single crystalline silicon or intrinsic silicon or another suitable semiconductor material; and the channel layers 215C and 215D (for PMOS transistors) may comprise silicon, germanium, silicon germanium, or another suitable semiconductor material.

Referring to FIGS. 2, 4, 5, and 6, the device 200 further includes n-type doped source/drain (S/D) features 260N and p-type doped source/drain features 260P in the source/drain regions. For example, source/drain features 260N are disposed over both sides of the gate stack 240A and connected by the channel layers 215A to form NMOS FinFET PG-1. Similarly, source/drain features 260N are disposed over both sides of the gate stack 240B, 240C, and 240D and connected by the channel layers 215B, 215E, and 215F to form NMOS FinFET PD-1, PD-2, and PG-2, respectively. Source/drain features 260P are disposed over both sides of the gate stack 240B and 240C and connected by the channel layers 215C and 215D to form PMOS FinFET PU-1 and PU-2, respectively.

The source/drain features 260P and 260N may be formed using epitaxial growth. For example, a semiconductor material is epitaxially grown from portions of substrate 202 and the respective channel layers 215, forming epitaxial source/drain features 260P and 260N. In some embodiments, the epitaxial source/drain features 260N may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260P may include silicon germanium or germanium and may be doped with boron, other p-type dopant, or combinations thereof (for example, forming Si:Ge:B epitaxial source/drain features). The epitaxial source/drain features 260P and 260N may be doped in-situ or ex-situ. In some embodiments, epitaxial source/drain features 260P and/or 260N include more than one epitaxial semiconductor layer, where the epitaxial semiconductor layers can include the same or different materials and/or dopant concentrations.

As shown in FIGS. 3, 4, and 5, each gate stack 240 includes a gate electrode layer 350 disposed over a gate dielectric layer 282. The gate electrode layer 350 and the gate dielectric layer 282 engages the top and sidewalls of each channel layer 215. In some further embodiments, the gate stack 240 further includes an interfacial layer (such as having silicon dioxide, silicon oxynitride, or other suitable materials) between the gate dielectric layer 282 and the channel layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The gate dielectric layer 282 may be formed by chemical oxidation, thermal oxidation, atomic layer deposition (ALD), chemical vapor deposition (CVD), and/or other suitable methods. In some embodiments, the gate electrode layer 350 includes an n-type work function layer for NMOSFET device or a p-type work function layer for PMOSFET device and further includes a metal fill layer disposed over the work function layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

As shown in FIGS. 4 and 5, the device 200 includes gate spacers 247 on sidewalls of the gate stacks 240 and over the channel layers 215. The gate spacers 247 are formed by any suitable process and include a dielectric material such as silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, air gap, or a combination thereof. In some embodiments, gate spacers 247 include a multi-layer structure, such as a first dielectric layer that includes silicon nitride and a second dielectric layer that includes silicon oxide.

As shown in FIG. 3, the device 200 further includes gate-end dielectric features 404 that are disposed between an end of a gate stack 240 and an end of another gate stack 240. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof.

As shown in FIGS. 3, 4, and 5, the device 200 further includes a gate-top dielectric layer 408 that is disposed over each of the gate stacks 240. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof.

As shown in FIGS. 4, 5, and 6, the device 200 further includes silicide features 261 over the source/drain features 260N and 260P, and source/drain (S/D) contacts 406 over the silicide features 261. The silicide features 261 may be formed by depositing one or more metals over the S/D features 260N/P, performing an annealing process to the device 200 to cause reaction between the one or more metals and the S/D features 260N/P to produce the silicide features 261, and removing un-reacted portions of the one or more metals. The silicide features 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer functions to prevent metal materials of the metal fill layer from diffusing into the dielectric layers adjacent the S/D contacts 406. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406.

As shown in FIGS. 4, 5, and 6, the device 200 further includes an inter-layer dielectric (ILD) layer 270. The ILD layer 270 is disposed over the isolation structure 230, the S/D features 260N/P, the S/D contacts 406, the gate stacks 240, the gate spacers 247, and the gate-top dielectric layer 408. In some embodiments, the device 200 further includes a contact etch stop layer (CESL) between the ILD layer 270 and the S/D features 260N/P, the gate stacks 240, and the top spacers 247. The CESL may include $La_2O_3$, $Al_2O_3$, SiOCN, SiOC, SiCN, SiO$_2$, SiC, ZnO, ZrN, Zr$_2$Al$_3$O$_9$, TiO$_2$, TaO$_2$, ZrO$_2$, HfO$_2$, Si$_3$N$_4$, Y$_2$O$_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, undoped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

As shown in FIGS. 2, 3, 5, and 6, the device 200 further includes butted contacts 409 that electrically connect the S/D contacts 406 to the respective gate stack 240C and 240B and various gate vias "VG" and source/drain contact vias "V0." Each of the gate vias, S/D contact vias, and butted contacts may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

Figure 7:
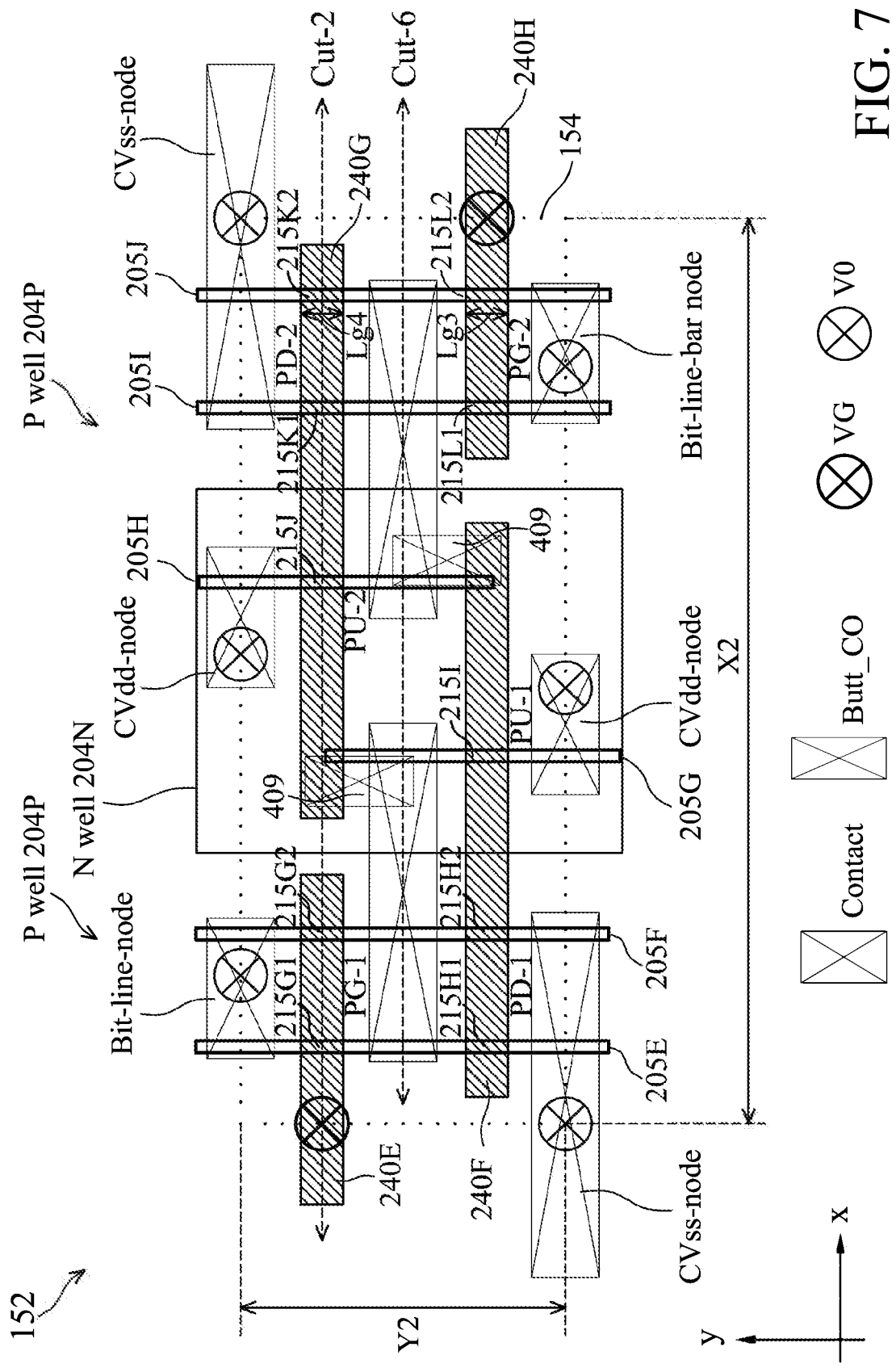
FIGS. 7 and 11 show portions of a layout of the SRAM cell of FIG. 1B, in accordance with another embodiment where the SRAM cell is a high-current memory cell and the transistors are FinFET.

FIG. 7 shows a layout of the HC SRAM macro 152, particularly, a layout of certain layers (or features) of the HC SRAM cell 154. Referring to FIG. 7, the SRAM cell 154 occupies an area indicated by the dotted rectangular box with a length X2 along the "x" direction and a width Y2 along the "y" direction. The SRAM macro 152 includes an array of such SRAM cells 154 arranged in rows along the "x" direction and in columns along the "y" direction. In that regard, the length X2 is also the pitch of the array of memory cells 154 along the "x" direction, and the width Y2 is also the pitch of the array of memory cells 154 along the "y" direction. In the present embodiment, the area occupied by the HC SRAM cell 154 is greater than the area occupied by the HD SRAM cell 104 (see FIG. 2), providing a higher performance (e.g., a higher sourcing current) than the HD SRAM cell 104. In an embodiment, a ratio of X2 to X1 is greater than 1.1, such as in a range of 1.1 to 1.5, and the dimensions Y1 and Y2 are substantially the same. For example, the SRAM cells 104 and 154 may be laid out in a same row to simplify layout. In an embodiment, each of the SRAM cells 104 and 154 is designed to be a thin slice to simplify the layout. For example, a ratio of X1 to Y1 may be greater than 2, such as in a range of 2 to 2.5, and a ratio of X2 to Y2 may be greater than 2.5, such as in a range of 2.5 to 3.5.

The HC SRAM cell 154 includes active regions 205 (including 205E, 205F, 205G, 205H, 205I, and 205J) that are oriented lengthwise along the "y" direction, and gate stacks 240 (including 240E, 240F, 240G and 240H) that are oriented lengthwise along the "x" direction. The active regions 205G and 205J are disposed over an N Well 204N. The active regions 205E-F and 205I-J are disposed over P Wells 204P that are on both sides of the N well 204N along the "x" direction. The gate stacks 240 engage the channel regions of the respective active regions 205 to form transistors. In that regard, the gate stack 240E engages the channel region 215G1 of the active region 205E and the channel region 215G2 of the active region 205F to form an NMOSFET as the pass-gate transistor PG-1; the gate stack 240F engages the channel region 215H1 of the active region 205E and the channel region 215H2 of the active region 205F to form an NMOSFET as the pull-down transistor PD-1 and engages the channel region 215I of the active region 205G to form a PMOSFET as the pull-up transistor PU-1; the gate stack 240G engages the channel region 215K1 of the active region 205I and the channel region 215K2 of the active region 205J to form an NMOSFET as the pull-down transistor PD-2 and engages the channel region 215J of the active region 205H to form a PMOSFET as the pull-up transistor PU-2; and the gate stack 240H engages the channel region 215L1 of the active region 205I and the channel region 215L2 of the active region 205J to form an NMOSFET as the pass-gate transistor PG-2. Effectively, each of the pull-down transistors PD-1, PD-2, PG-1, and PG-2 in the HC SRAM cell 154 has its respective channel region formed with two semiconductor fins to provide higher current sourcing capability than their counterparts in the HD SRAM cell 104, while each of the pull-up transistors PU-1 and PU-2 in the HC SRAM cell 154 has its channel region formed with a single semiconductor fin, same as their counterparts in the HD SRAM cell 104. In some embodiments, each of the pull-down transistors PD-1, PD-2, PG-1, and PG-2 in the HC SRAM cell 154 has its channel region formed with more than two semiconductor fins to further increase the current sourcing capability. The transistor channels 215G1 through 215L2 are oriented lengthwise along the "y" direction (i.e., along a direction from source to drain or vice versa), and widthwise along the "x" direction. The channel 215L2 has a gate length of Lg3, while the channel 215K2 has a gate length of Lg4. In the present embodiment, the gate lengths Lg3 and Lg4 are about the same, which are defined by the width of the gate stacks 240H and 240G respectively. Further, the lengths of the channels 215G1, 215G2, 215H1, 215H2, 215I, 215J, 215K1, 215K2, 215L1, and 215L2 are about the same in the present embodiment, and they are about the same as the lengths of the channels 215A, 215B, 215C, 215D, 215E, and 215F in the HD SRAM memory cell 104. The HC SRAM cell 154 further includes source/drain contacts disposed over the source/drain regions of the active regions 205 (the source/drain regions are disposed on both sides of the respective channel regions), butted contacts (Butt_Co) 409 disposed over and connecting the active region 205G to the gate stack 240G and connecting the active region 205H to the gate stack 240F, source/drain contact vias ("V0") disposed over and connecting to the source/drain contacts, and two gate vias ("VG") disposed over and connecting to the gate stacks 240E and 240H respectively. FIG. 7 further illustrates the circuit nodes CVss-node, CVdd-node, Bit-line-node, and Bit-line-bar-node, corresponding to the circuit nodes Vss, CVdd, BL, and BLB in FIG. 1B.

Figure 8:
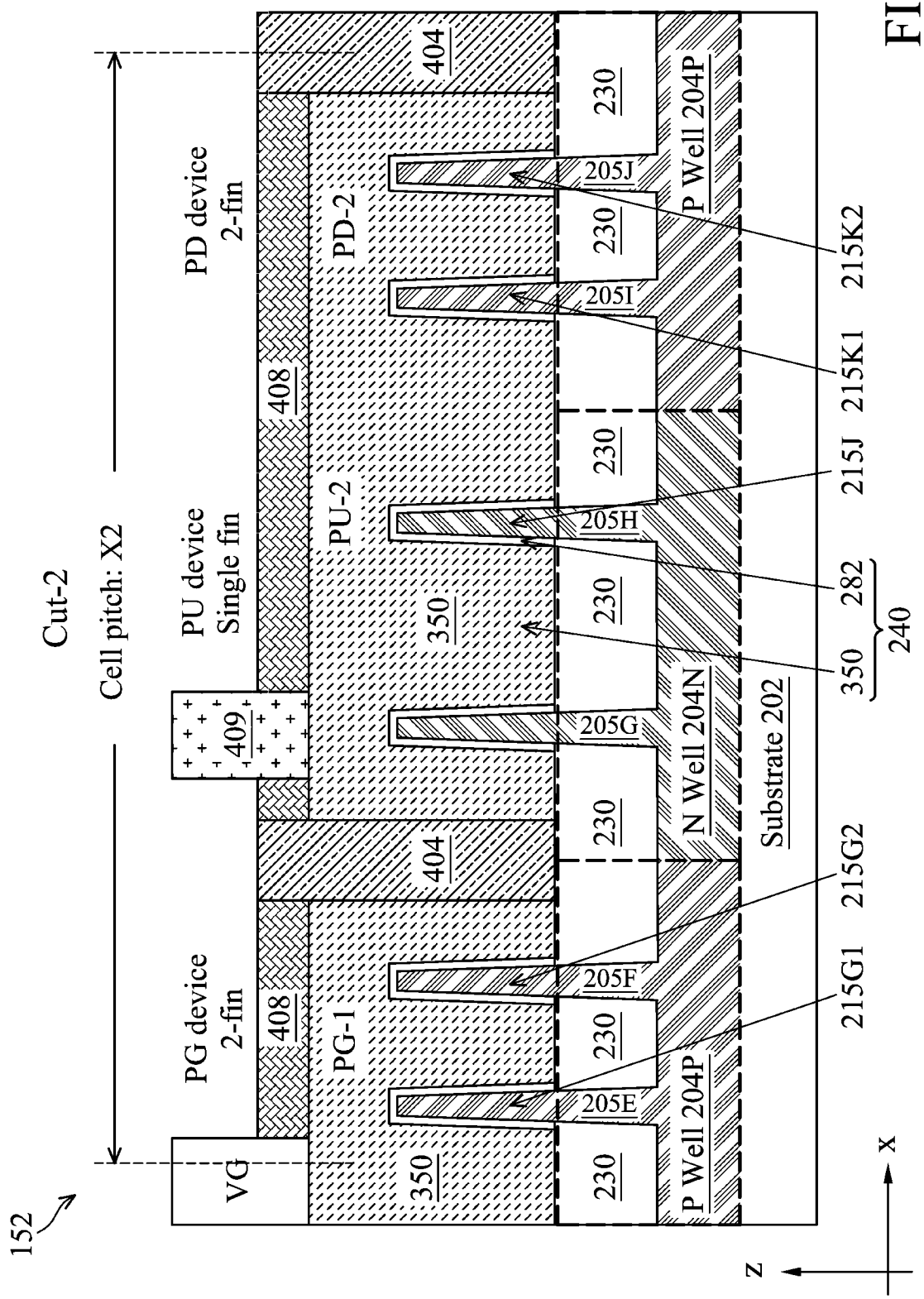
FIGS. 8 and 9 show cross-sectional views of the SRAM cell of FIG. 7, in portion, along the "Cut-2" line and the "Cut-6" line in FIG. 7, respectively, in accordance with some embodiments of the present disclosure.
Figure 9:
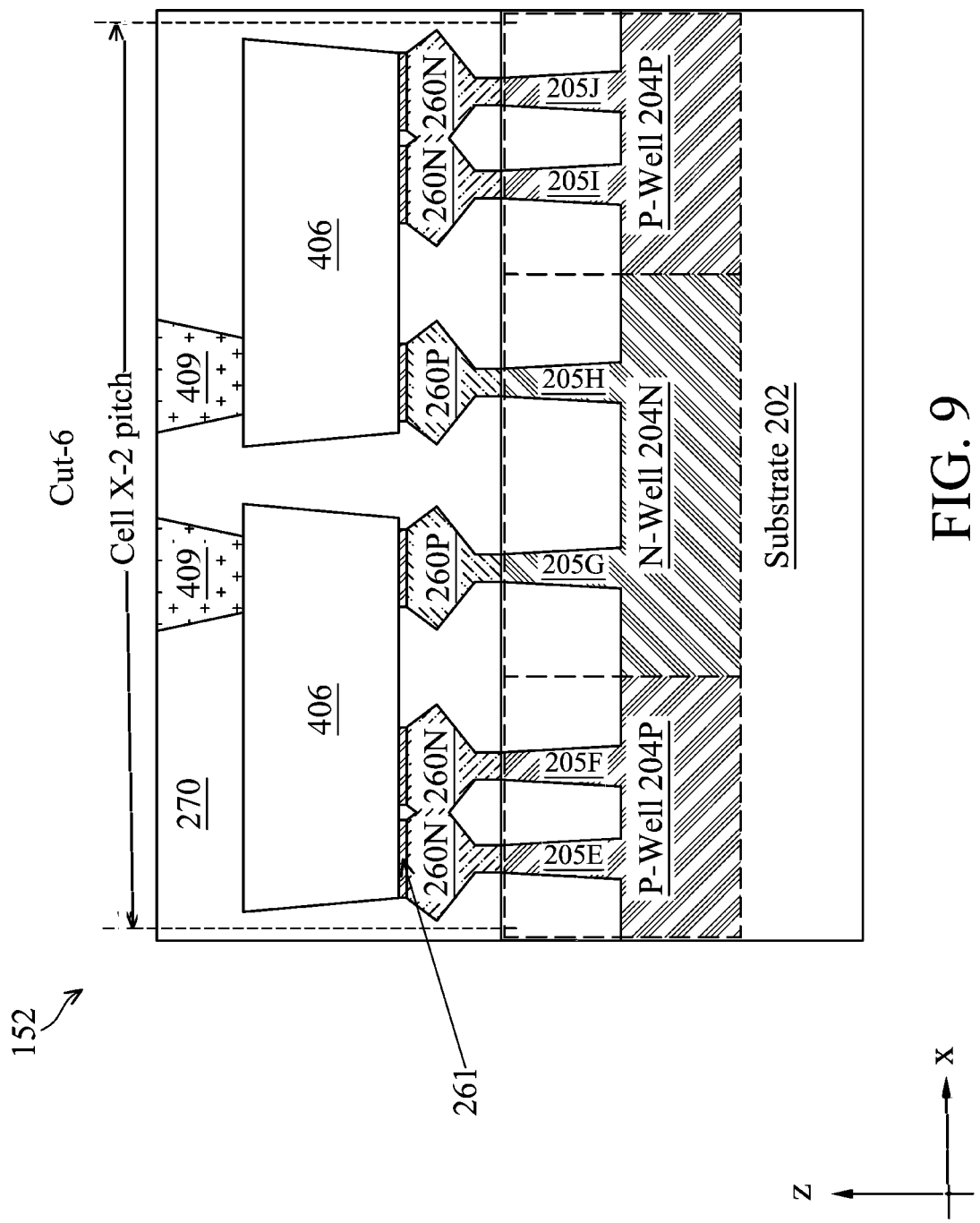

FIGS. 8 and 9 illustrate cross-sectional views of the HC SRAM cell 154 along the "Cut-2" line and the "Cut-6" line in FIG. 7, respectively. Various features of the HC SRAM cell 154 are the same as or similar to those of the HD SRAM cell 104, with like reference numerals denoting like features. Referring to FIGS. 7, 8, and 9 collectively, in the present embodiment, the active regions 205 include transistor channels 215 in the shape of semiconductor fins, and source/drain feature 260 (including 260P for PMOSFET and 260N for NMOSFET) in the source/drain regions that sandwich the channel regions. The source/drain features 260N that belong to the same pull-down or pass-gate transistor in the HC SRAM cell 154 may merge as depicted in FIG. 9. In the present embodiment, the source/drain features 260P in the HD SRAM cell 104 (FIG. 6) are doped with an extra dose of p-type dopant (such as boron) than the source/drain features 260P in the HC SRAM cell 154 (FIG. 9). In an embodiment, the boron dopant concentration in the source/drain features 260P of the HC SRAM cells 154 is in a range of about 1E19 atoms/cm$^3$ to about 6E20 atoms/cm$^3$ and the boron dopant concentration in the source/drain features 260P of the HD SRAM cells 104 is about two to five times higher than that in the source/drain features 260P in the HC SRAM cells 154. Providing the extra dose of p-type dopant is for tuning the HD SRAM cell 104 and the HC SRAM 154 to achieve different performance goals. For example, the extra dose of p-type dopant lowers the threshold voltage (Vt) and increases the Ion current of the pull-up transistors in the HD SRAM cell 104. This leads to a higher alpha ratio in the HD SRAM cell 104 than in the HC SRAM cell 154 (an alpha ratio refers to the ratio of the pull-up transistor's Ion to the pass-gate transistor's Ion), thus a lower leakage current and lower standby current in the HD SRAM cell 104. This in turns leads to a better cell stability in the HD SRAM cell 104. For example, the HD SRAM cell 104 has a better capability to store and maintain a logic high state. For the HC SRAM cell 154, since (a) there are more fins in the pass-gate transistors than in the pull-up transistors and (b) the pull-up transistors have a lower p-type doping than in the HD SRAM cell 104, the alpha ratio of the HC SRAM cell 154 is lower than that of the HD SRAM cell 104. This leads to a better write margin in the HC SRAM cell 154 for fast write operations. Thus, the HC SRAM cell 154 does not need to be coupled to any write-assist circuit (thereby reducing the footprint of the HC SRAM macro 152), while the HD SRAM cell 104 is coupled to write-assist circuit to boost its write performance.

Further, in some embodiments, the work-function metal layer in the gate electrode 350 of the n-type FinFET (PG-1, PG-2, PD-1, PD-2) of the HD SRAM cell 104 has the same material as the work-function metal layer in the gate electrode 350 of the n-type FinFET (PG-1, PG-2, PD-1, PD-2) of the HC SRAM cell 154. For example, they may both include a layer of TiN or WN—C(Tungsten-nitride-carbon). However, the former is thicker than the latter. This is provided for tuning the threshold voltages of the n-type FinFET in the HD SRAM cell 104 to be higher than that of the n-type FinFET in the HC SRAM cell 154. For example, in some embodiments, the work-function metal layer in the gate electrode 350 includes an aluminum-containing layer above the layer of TiN or WN—C. Aluminum elements from the aluminum-containing layer may diffuse through layers thereunder to the interface with the gate dielectric layer 282. Such diffusion often lowers the threshold voltage for NMOSFET and increases the threshold voltage for PMOSFET. Having a thicker layer of TiN or WN—C between the aluminum-containing layer and the gate dielectric layer 282 can be more effective in blocking such aluminum diffusion, thus creating a higher threshold voltage in n-type FinFET (PG-1, PG-2, PD-1, PD-2) of the HD SRAM cell 104 than those in the HC SRAM cell 154. The higher threshold voltage leads to lower leakage current and lower standby current in the HD SRAM 104.

In some embodiments, the work-function metal layer in the gate electrodes 350 of the n-type and p-type FinFET (PG-1, PG-2, PD-1, PD-2, PU-1, PU-2) of the HD SRAM cell 104 are formed by the same material, while the work-function metal layer in the gate electrodes 350 of the n-type FinFET (PG-1, PG-2, PD-1, PD-2) of the HC SRAM cell 154 is formed by different material(s) than that in the p-type FinFET (PU-1, PU-2) of the HC SRAM cell 154. Using the same work-function metal layer for both NMOSFET and PMOSFET in the HD SRAM cell 104 obviates the N/P work function boundary issue, which refers to the issues of threshold voltage variation in the NMOSFET and PMOSFET due to the patterning of different work function metal layers. For HC SRAM cell 154, the different work function metal layers in the NMOSFET and PMOSFET can be used for creating low threshold voltages in both NMOSFET and PMOSFET, thereby increasing the operation speed of the HC SRAM cell 154. Still further, the threshold voltage (Vt) of the pull-down FinFET (PD-1, PD-2) of the HD SRAM cell 104 is higher than the threshold voltage of the pull-down FinFET (PD-1, PD-2) of the HC SRAM cell 154. For example, the former may be greater than the latter by about 30 mV in some embodiments. This leads to lower leakage current and lower standby current in the HD SRAM cell 104 than in the HC SRAM cell 154.

Figure 10:
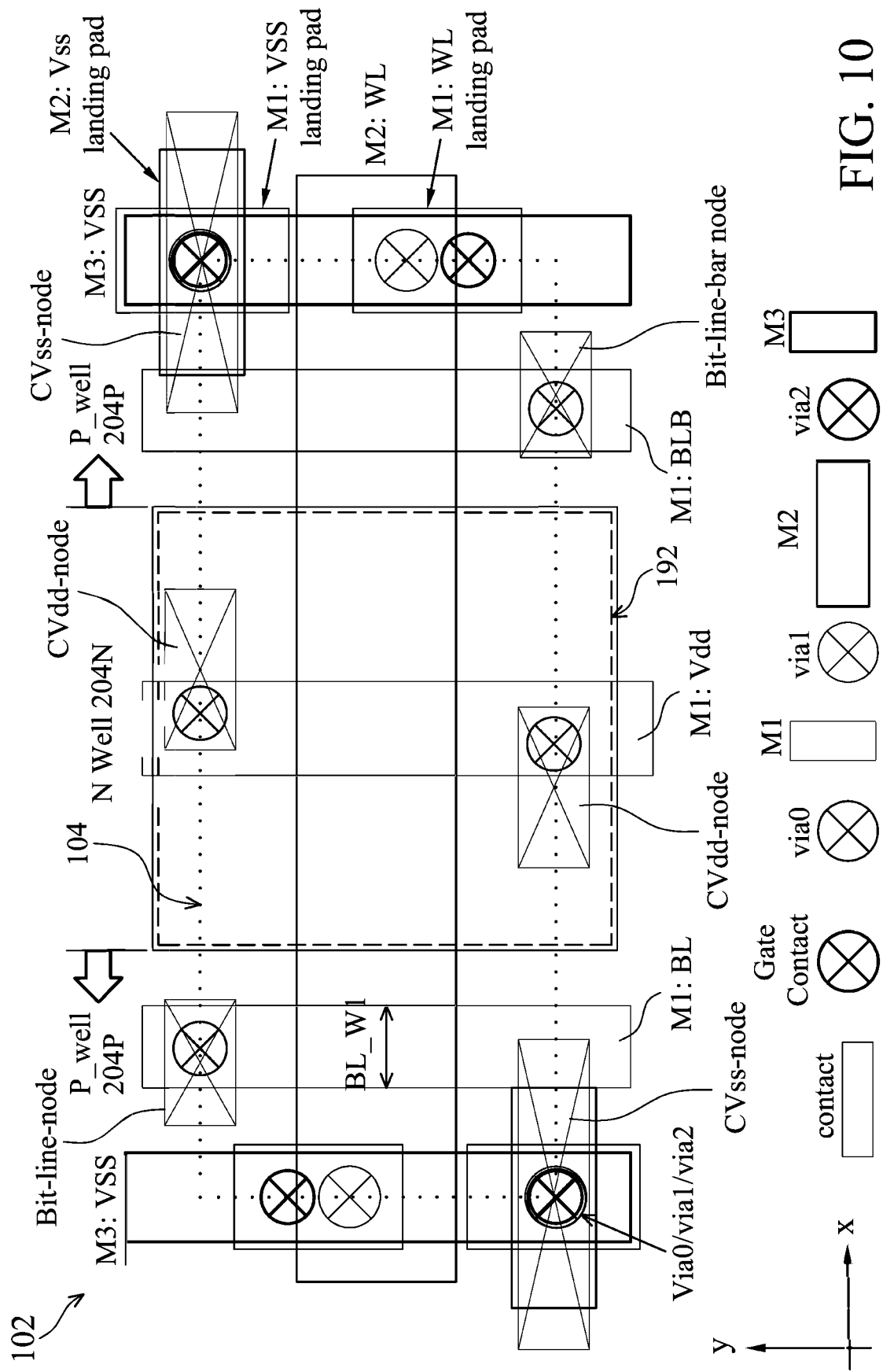

FIG. 10 shows a layout of certain metal layers of the HD SRAM macro 102. For simplicity, the active regions 205 and the gate stacks 240 are omitted, while the dotted box representing the HD SRAM cell 104 is still shown in FIG. 10. Referring to FIG. 10, the bit line BL, the inverse bit line BLB, and the positive power supply line Vdd (or CVdd) are implemented as conductors (metal lines) in the first metal layer M1 and are connected to the underlying source/drain contacts through vias ("via0"). These conductors in the M1 layer are oriented lengthwise along the "y" direction. The word line WL and Vss landing pads are implemented as conductors (metal lines) in the second metal layer M2 immediately above the M1 layer and are connected to the underlying features in the M1 layer (such as a Vss landing pad and a WL landing pad) through vias ("via1"). These conductors in the M2 layer are oriented lengthwise along the "x" direction. The negative power supply line (or ground) Vss are implemented as conductors (metal lines) in the third metal layer M3 immediately above the M2 layer, which are oriented lengthwise along the "y" direction and are connected to the underlying features in the M2 layer (such as a Vss landing pad) through vias ("via2"). As shown in FIG. 10, the bit line conductors (BL and BLB) in the M1 layer have a width BL_W1 along the "x" direction.

Figure 11:
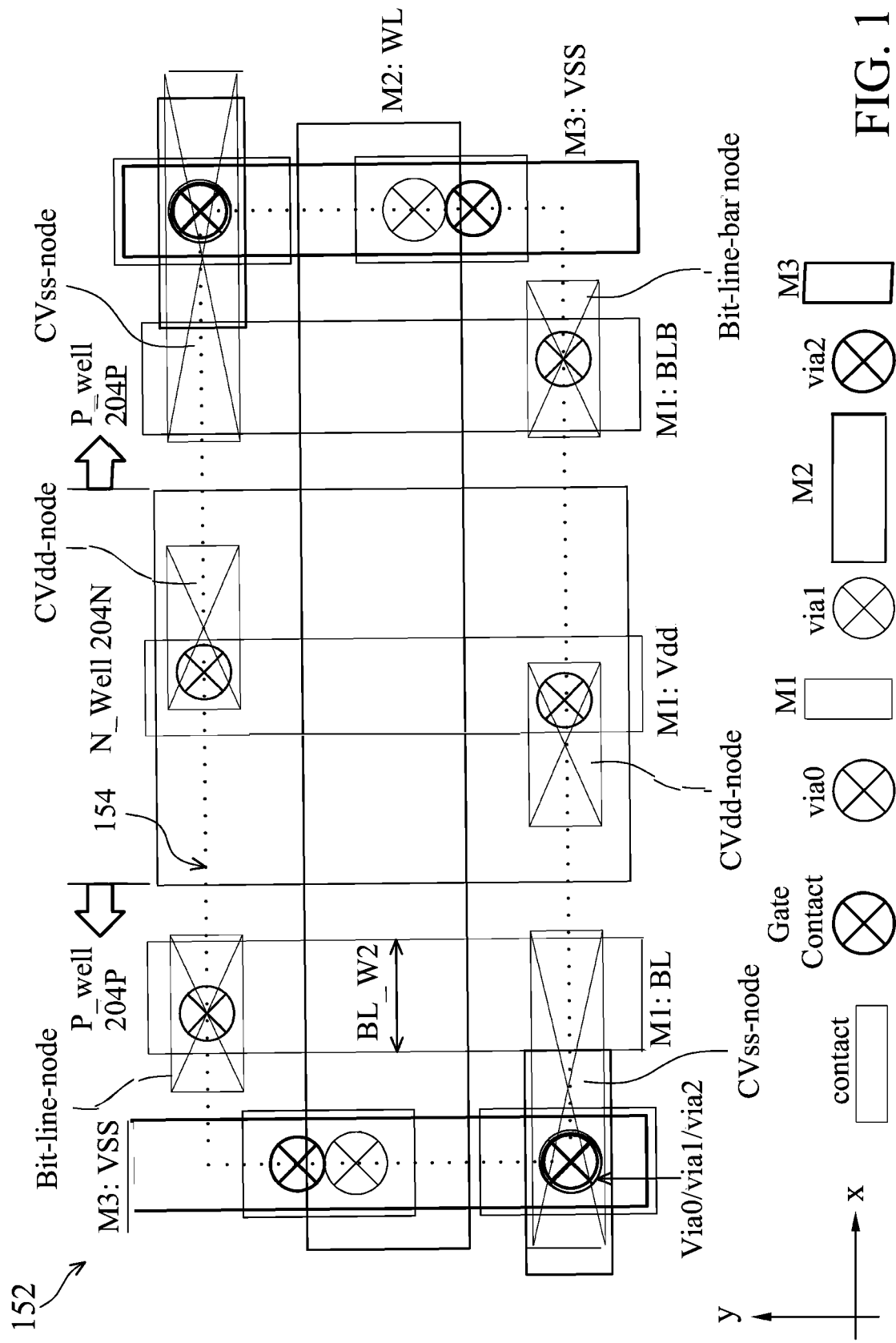

FIG. 11 shows a layout of certain metal layers of the HC SRAM macro 152. These metal layers are structurally similar to their counterparts in the HD SRAM macro 102. For example, the bit line conductors (BL and BLB) and the positive power supply line Vdd are implemented as conductors (metal lines) in the first metal layer M1; the word line WL and Vss landing pads are implemented as conductors (metal lines) in the second metal layer M2; and the negative power supply line (or ground) Vss are implemented as conductors (metal lines) in the third metal layer M3. As shown in FIG. 11, the bit line conductors (BL and BLB) in the M1 layer have a width BL_W2 along the "x" direction. In the present embodiment, the bit line conductors of the HC SRAM macro 152 are wider than the bit line conductors of the HD SRAM macro 102 (i.e., BL_W2>BL_W1) so that higher current can be conducted through the bit line conductors in the HC SRAM macro 152 while reducing voltage drop during read and write operations. In some embodiments, a ratio of BL_W2 to BL_W1 is greater than 1.2. In some embodiments, a ratio of BL_W2 to BL_W1 is in a range of 1.1 to 2.

Figure 12:
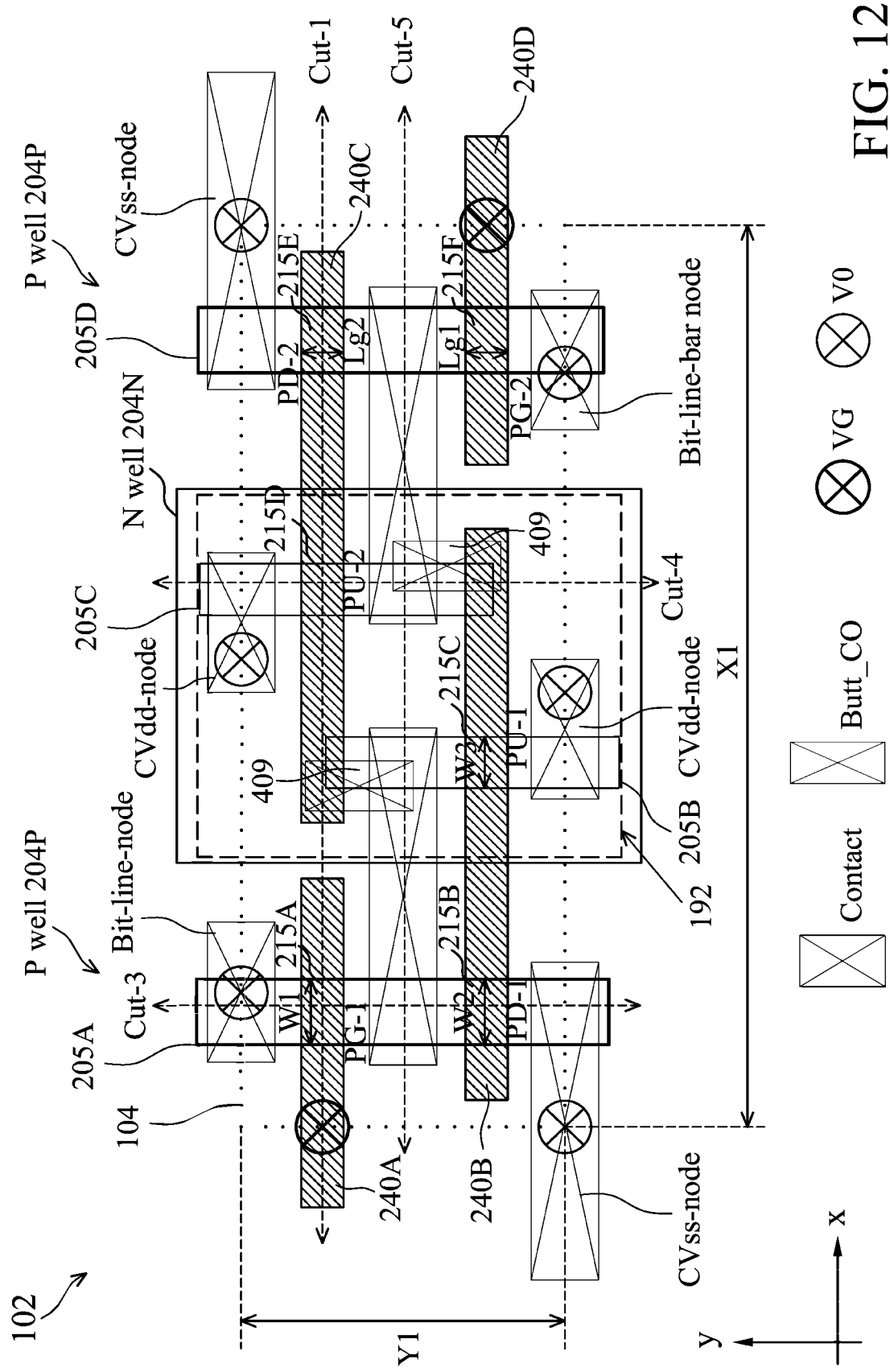
FIGS. 12 and 20 show portions of a layout of the SRAM cell of FIG. 1B, in accordance with an embodiment where the SRAM cell is a high-density memory cell and the transistors are GAA transistors.
Figure 17:
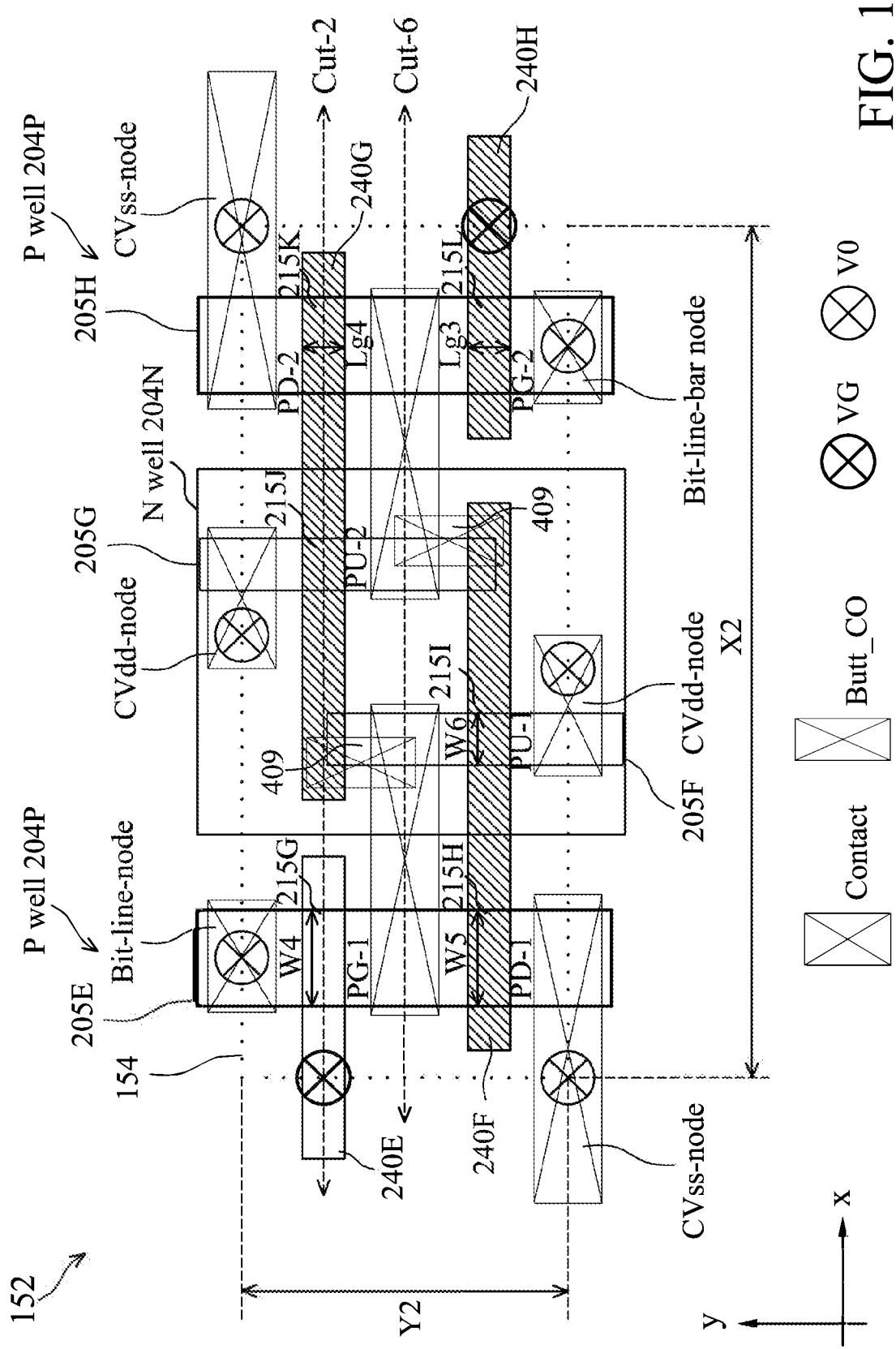
FIGS. 17 and 21 show portions of a layout of the SRAM cell of FIG. 1B, in accordance with another embodiment where the SRAM cell is a high-current memory cell and the transistors are GAA transistors.
Figure 18:
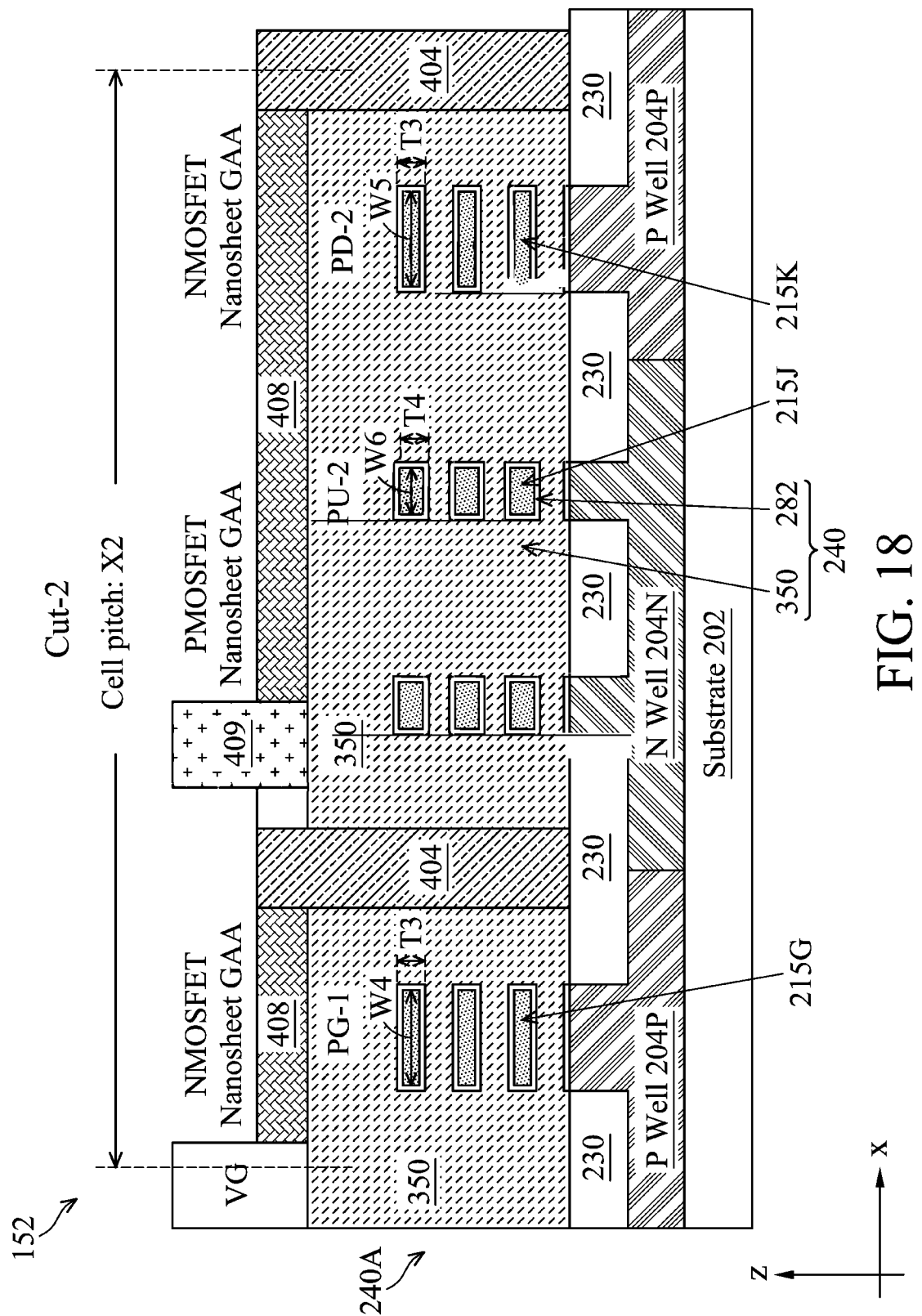
FIGS. 18 and 19 show cross-sectional views of the SRAM cell of FIG. 17, in portion, along the "Cut-2" line and the "Cut-6" line in FIG. 17, respectively, in accordance with some embodiments of the present disclosure.
Figure 19:
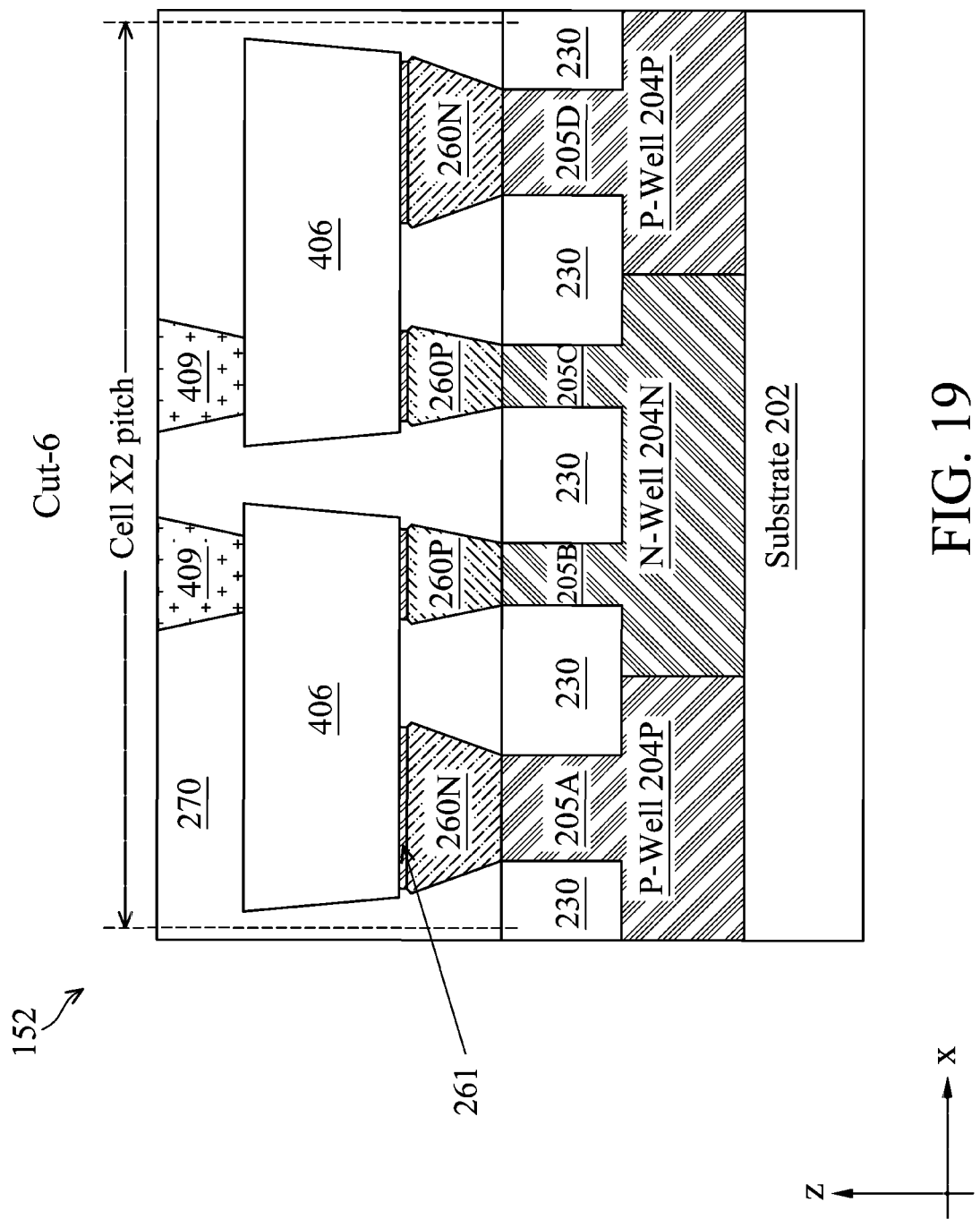

FIGS. 12 and 17 show portions of layout diagrams of the HD SRAM macro 102 and the HC SRAM macro 152, respectively, according to another embodiment where the various pull-up, pull-down, and pass-gate transistors are implemented as GAA transistors. FIGS. 13, 14, 15, and 16 illustrate cross-sectional view of the HD SRAM macro 102 along the "Cut-1," "Cut-3," "Cut-4," and "Cut-5" lines in FIG. 12, respectively. FIGS. 18 and 19 illustrate cross-sectional view of the HC SRAM macro 152 along the "Cut-2" and "Cut-6" lines in FIG. 17, respectively. Many features of the HD SRAM macro 102 in FIGS. 12-16 and the HC SRAM macro 152 in FIGS. 17-19 are the same as those in FIGS. 2-6 and those in FIGS. 7-9, respectively, with the same reference numerals denoting the same features. For simplicity, the following discussion only focuses on some of the differences between the two embodiments.

Referring to FIGS. 12, 13, 14, 15, and 16 collectively, in the present embodiment, the active regions 205 (205A, 205B, 205C, and 205D) in the HD SRAM macro 102 (or in the HD SRAM cell 104) include horizontally oriented vertically stacked transistor channels 215 (215A, 215B, 215C, 215D, 215E, and 215F) in the respective channel regions, and source/drain feature 260 (including 260P for PMOSFET and 260N for NMOSFET) in the source/drain regions that sandwich the channel regions. The transistor channels 215 (including 215A-F) are oriented lengthwise along the "y" direction and widthwise along the "x" direction. FIG. 12 illustrates that the channel 215F has a gate length of Lg1 and the channel 215E has a gate length of Lg2. In the present embodiment, the gate lengths Lg1 and Lg2 are about the same, which are defined by the width of the gate stacks 240D and 240C respectively. Further, the lengths of the channels 215A, 215B, 215C, 215D, 215E, and 215F are about the same in the present embodiment. The widths of the channels 215A through 215F are designed to be different to provide performance enhancements. As shown in FIG. 12, the widths of the channels 215A and 215F (for the transistors PG-1 and PG-2 respectively) is W1, the widths of the channels 215B and 215E (for the transistors PD-1 and PD-2 respectively) is W2, and the widths of the channels 215C and 215D (for the transistors PU-1 and PU-2 respectively) is W3. In the present embodiment, the width W2 is about the same as the width W1, and the widths W1 and W2 are greater than the width W3.

Figure 13:
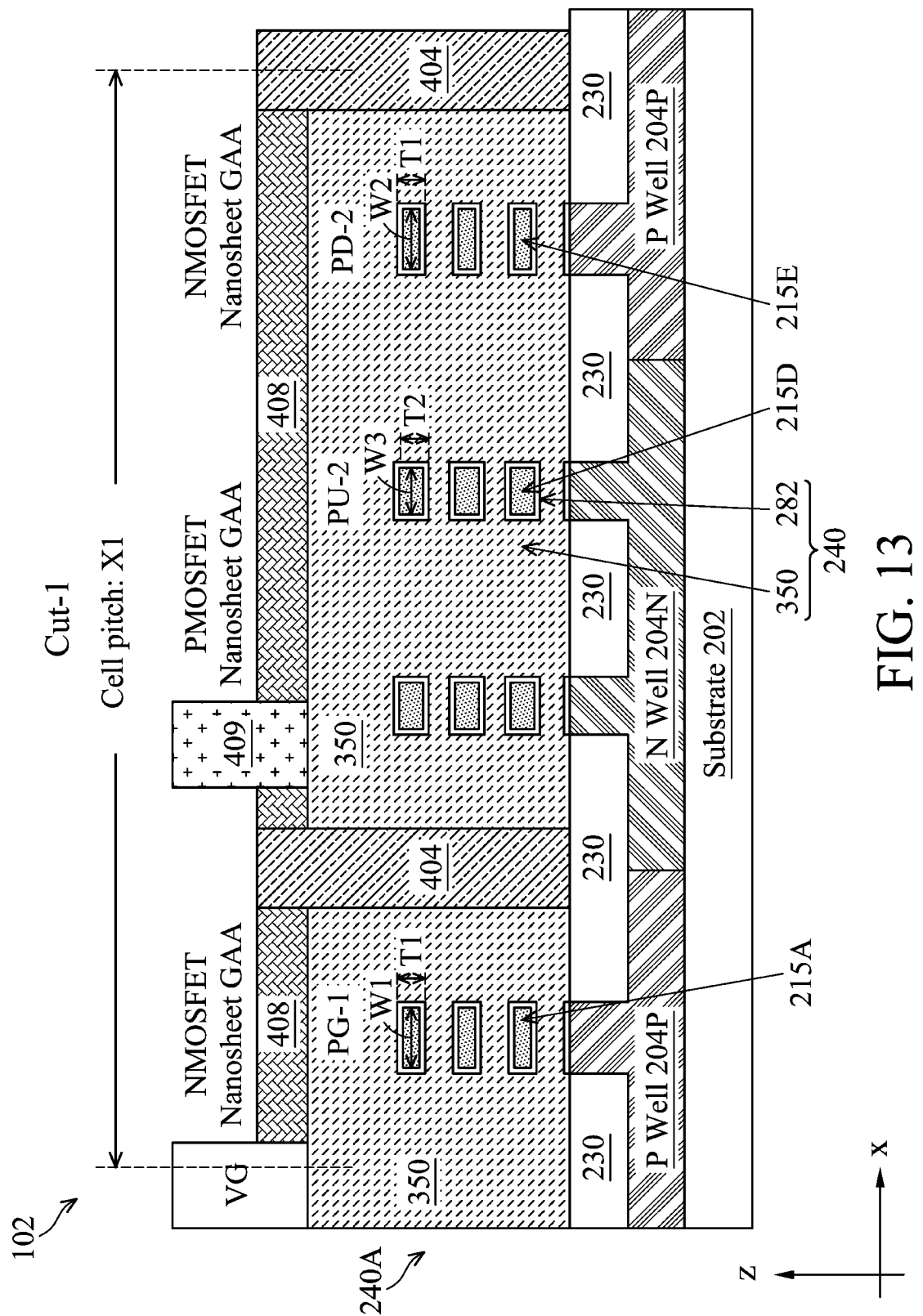
FIGS. 13, 14, 15, and 16 show cross-sectional views of the SRAM cell of FIG. 12, in portion, along the "Cut-1" line, the "Cut-3" line, the "Cut-4" line, and the "Cut-5" line in FIG. 12, respectively, in accordance with some embodiments of the present disclosure.
Figure 14:
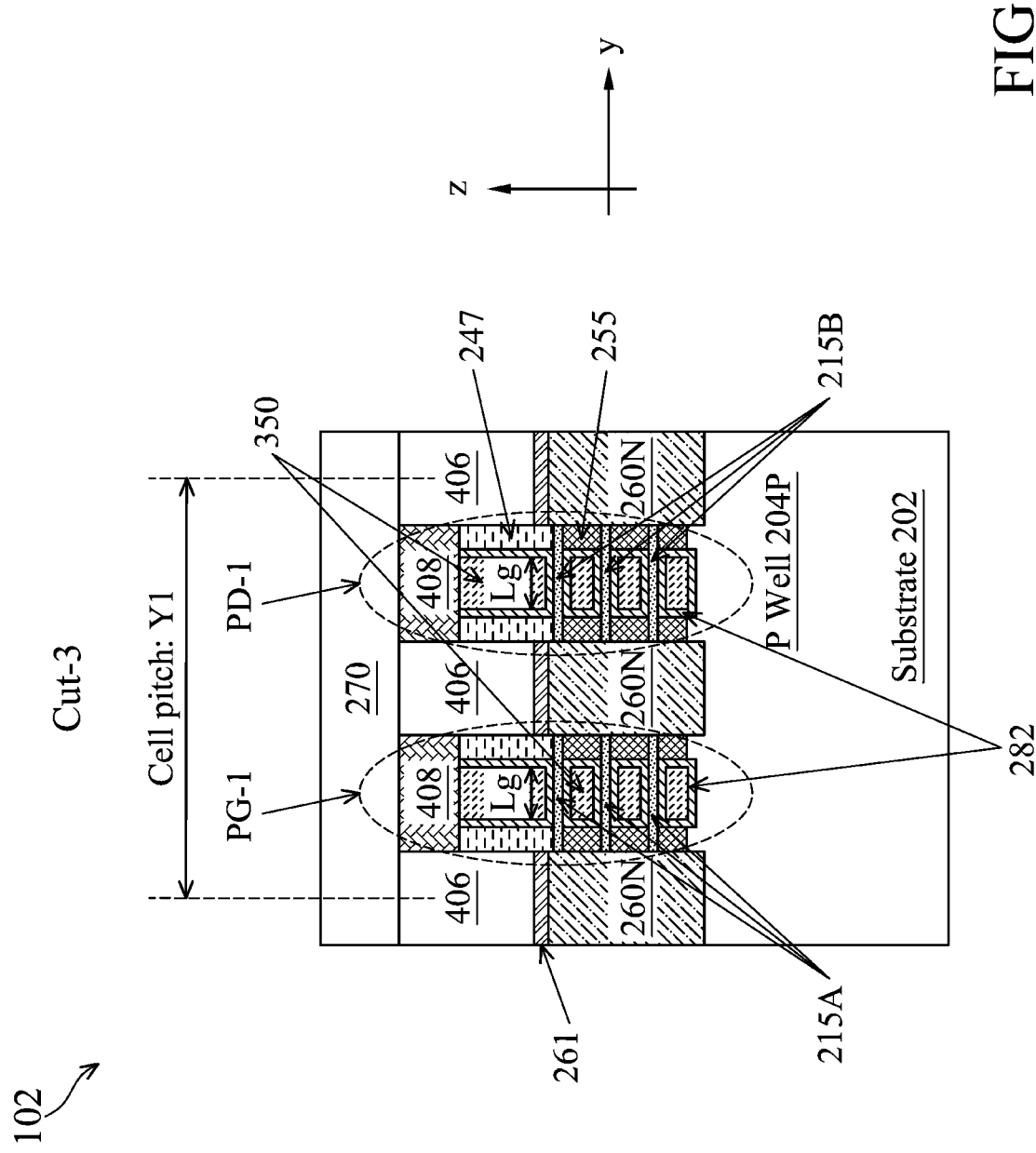
Figure 15:
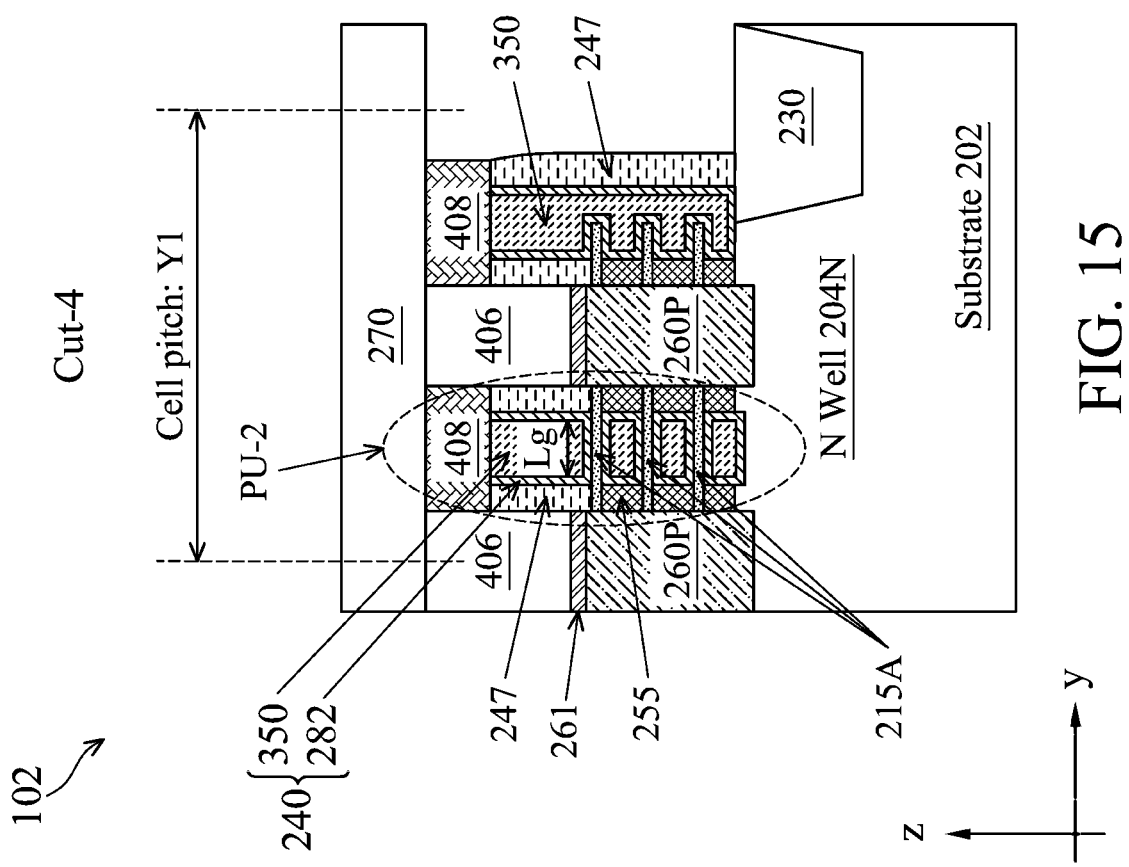
Figure 16:
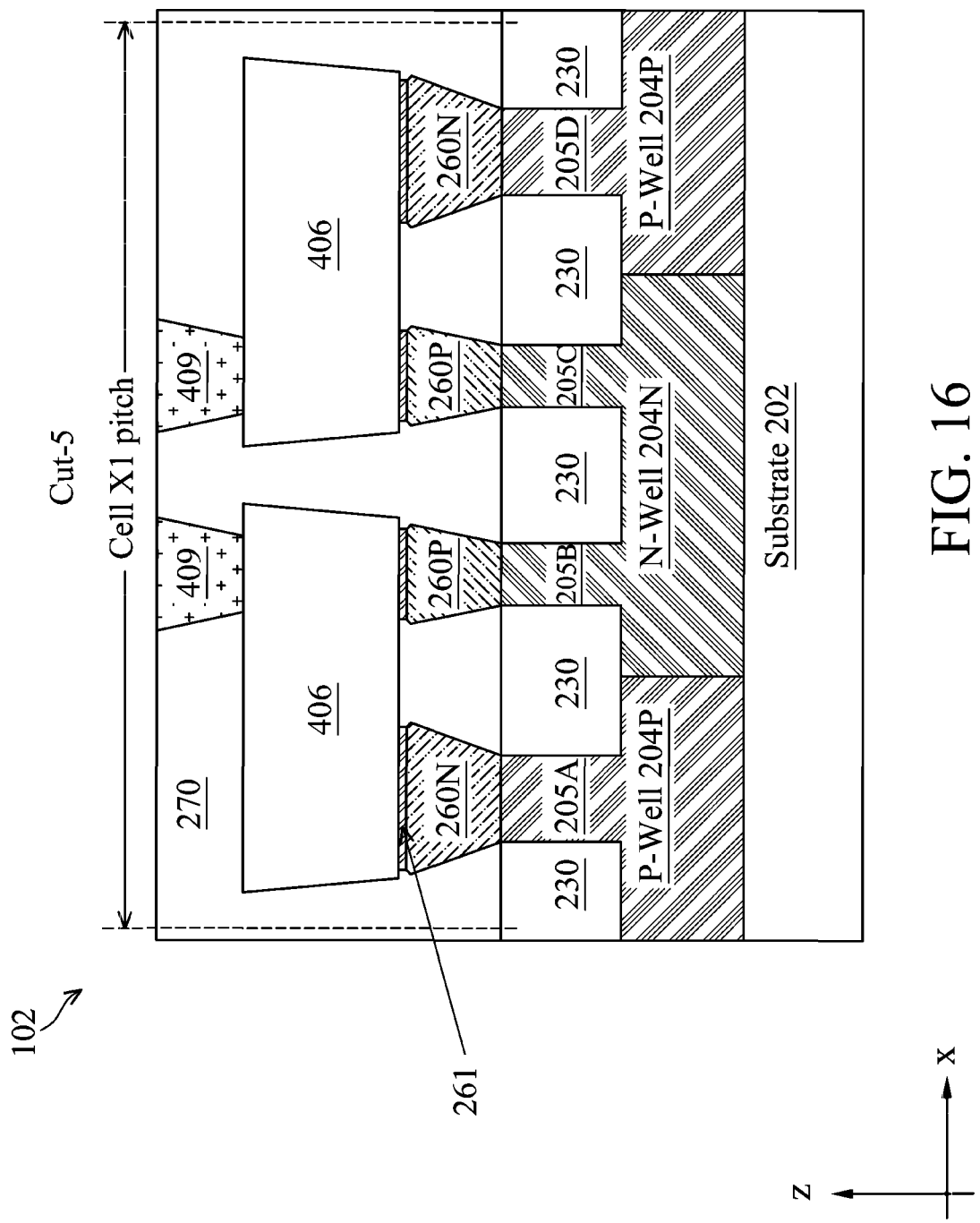

As shown in FIGS. 13, 14, and 15, the channel layers 215A are suspended over the P well 204P and connecting a pair of source/drain features 260N. The channel layers 215A are stacked one over another along the "z" direction (which is the vertical direction or channel thickness direction), and each of the channel layers 215A is oriented lengthwise along the "y" direction (FIG. 14) and widthwise along the "x" direction (FIG. 13). The other channel layers 215B, 215C, 215D, 215E, and 215F are similarly configured. The gate stack 240A (including a gate dielectric layer 282 and a gate electrode 350) wraps around each of the channel layer 215A (FIG. 13), forming an NMOS gate-all-round (GAA) transistor PG-1. The other transistors PU-1, PU-2, PD-1, PD-2, and PG-2 are similarly configured as GAA transistors. The channel layers 215A-F may include single crystalline silicon or intrinsic silicon. Alternatively, the channel layers 215A-F may comprise germanium, silicon germanium, or another suitable semiconductor material(s). Initially, the channel layers 215A-F are formed as part of a semiconductor layer stack that include the channel layers 215A-F and other semiconductor layers of a different material. During a gate replacement process, the semiconductor layer stack in the channel regions are selectively etched to remove the other semiconductor layers, leaving the channel layers 215A-F suspended over the substrate 202 and between the respective source/drain features 260P, 260N. This is also referred to as a channel release process.

As shown in FIG. 13, channel layers 215 for the GAA PG-1 and PG-2 transistors have a width W1 along the "x" direction and a thickness "T1" along the "z" direction, channel layers 215 for the GAA PD-1 and PD-2 transistors have a width W2 along the "x" direction and a thickness "T1" along the "z" direction, and channel layers 215 for the GAA PU-1 and PU-2 transistors have a width W3 along the "x" direction and a thickness "T2" along the "z" direction. When the transistors are turned on, current flow through all surfaces of the respective channel layers 215. For example, the width of the effective conducting channel for a channel layer 215A is 2W1+2T1. Thus, the widths and the thicknesses of the channel layers 215 can be designed to achieve a particular performance target while the respective gate stack 240 can still maintain a full control of the channel layers 215 to suppress short channel effects. In the depicted embodiment, the thicknesses T1, T2, and T3 are about the same, though the present disclosure contemplates embodiments where the thicknesses T1, T2, and T3 are configured differently. Further, in the present embodiment, there are three channel layers 215 in each transistor. the present disclosure contemplates embodiments with more or less channel layers 215. For example, each transistor may have 2 to 10 channel layers 215 in some embodiments. In various embodiments, a ratio of W1 to T1 may be in a range of 0.9 to 4, such as in a range of 1.2 to 3; and a ratio of W3 to T2 may be in a range of 1 to 2. So, the shape of the channel layers 215 is like a rectangular bar or a sheet. In some embodiments, each of the widths W1, W2, and W3 may be in the range of about 4 nm to about 60 nm.

As shown in FIGS. 14 and 15, the device 200 further includes gate spacers 255 on sidewalls of the gate stack 240 and below the topmost channel layer 215. In the present disclosure, the gate spacers 247 are also referred to as outer spacers 247 or top spacers 247, and the gate spacers 255 are also referred to as inner spacers 255. The inner spacers 255 are disposed laterally between the source/drain features 260N (or 260P) and the gate stacks 240 and vertically between adjacent channel layers 215. In various embodiments, the top spacers 247 may have a width along the "y" direction in a range of about 3 nm to about 12 nm, and the inner spacers 255 may have a width along the "y" direction in a range of about 3 nm to about 12 nm.

Referring to FIGS. 17, 18, and 19 collectively, in the present embodiment, the active regions 205 (205E, 205F, 205G, and 205H) in the HC SRAM 152 include horizontally oriented vertically stacked transistor channels 215 (215G, 215H, 215I, 215J, 215K, and 215L) in the respective channel regions, and source/drain feature 260 (including 260P for PMOSFET and 260N for NMOSFET) in the source/drain regions that sandwich the channel regions. The transistor channels 215 (including 215G-L) are oriented lengthwise along the "y" direction and widthwise along the "x" direction. FIG. 17 illustrates that the channel 215L has a gate length of Lg3 and the channel 215K has a gate length of Lg4. In the present embodiment, the gate lengths Lg3 and Lg4 are about the same, which are defined by the width of the gate stacks 240H and 240G respectively. Further, the lengths of the channels 215G, 215H, 215I, 215J, 215K, and 215L are about the same in the present embodiment. The widths of the channels 215G through 215L are designed to be different to provide performance enhancements. As shown in FIG. 17, the widths of the channels 215G and 215L (for the transistors PG-1 and PG-2 respectively) is W4, the widths of the channels 215H and 215K (for the transistors PD-1 and PD-2 respectively) is W5, and the widths of the channels 215I and 215J (for the transistors PU-1 and PU-2 respectively) is W6. In the present embodiment, the width W4 is about the same as the width W5, and the widths W4 and W5 are greater than the width W6. Further, the width W5 (for the PD transistors in the HC SRAM cell 154) is greater than the width W2 (for the PD transistors in the HD SRAM cell 104) to provide the HC SRAM cell 154 with higher current sourcing capability than the HD SRAM cell 104. In some embodiments, a ratio of the width W5 to the width W2 is in a range of about 1.2 to about 5 such as in a range of 1.3 to 3.

In an embodiment, a ratio of X2 (the "x" pitch of the HC SRAM cells 154 in FIG. 17) to X1 (the "x" pitch of the HD SRAM cells 104 in FIG. 12) is greater than 1.1, such as in a range of 1.1 to 1.5, and the dimensions Y1 (the "y" pitch of the HD SRAM cells 104 in FIG. 12) and Y2 (the "y" pitch of the HC SRAM cells 154 in FIG. 17) are substantially the same. For example, the SRAM cells 104 and 154 may be laid out in a same row to simplify layout. In an embodiment, each of the SRAM cells 104 and 154 is designed to be a thin slice to simplify the layout. For example, a ratio of X1 to Y1 may be greater than 2, such as in a range of 2 to 2.5, and a ratio of X2 to Y2 may be greater than 2.5, such as in a range of 2.5 to 3.5.

In the present embodiment, the source/drain features 260P in the HD SRAM cell 104 (FIG. 16) are doped with an extra dose of p-type dopant (such as boron) than the source/drain features 260P in the HC SRAM cell 154 (FIG. 19). In an embodiment, the boron dopant concentration in the source/drain features 260P of the HC SRAM cells 154 is in a range of about 1E19 atoms/cm$^3$ to about 6E20 atoms/cm$^3$ and the boron dopant concentration in the source/drain features 260P of the HD SRAM cells 104 is about two to five times higher than that in the source/drain features 260P in the HC SRAM cells 154. The advantages of such doping are the same as those discussed with reference to FIGS. 6-9 (i.e., the FinFET embodiment). Further, in some embodiments, the work-function metal layer in the gate electrode 350 of the n-type FinFET (PG-1, PG-2, PD-1, PD-2) of the HD SRAM cell 104 has the same material as the work-function metal layer in the gate electrode 350 of the n-type FinFET (PG-1, PG-2, PD-1, PD-2) of the HC SRAM cell 154. For example, they may both include a layer of TiN or WN—C(Tungsten-nitride-carbon). However, the former is thicker than the latter. The advantages of such design are the same as those discussed with reference to FIGS. 6-9 (i.e., the FinFET embodiment). In some embodiments, the work-function metal layer in the gate electrodes 350 of the n-type and p-type FinFET (PG-1, PG-2, PD-1, PD-2, PU-1, PU-2) of the HD SRAM cell 104 are formed by the same material, while the work-function metal layer in the gate electrodes 350 of the n-type FinFET (PG-1, PG-2, PD-1, PD-2) of the HC SRAM cell 154 is formed by different material(s) than that in the p-type FinFET (PU-1, PU-2) of the HC SRAM cell 154. The advantages of such design are the same as those discussed with reference to FIGS. 6-9 (i.e., the FinFET embodiment).

Figure 20:
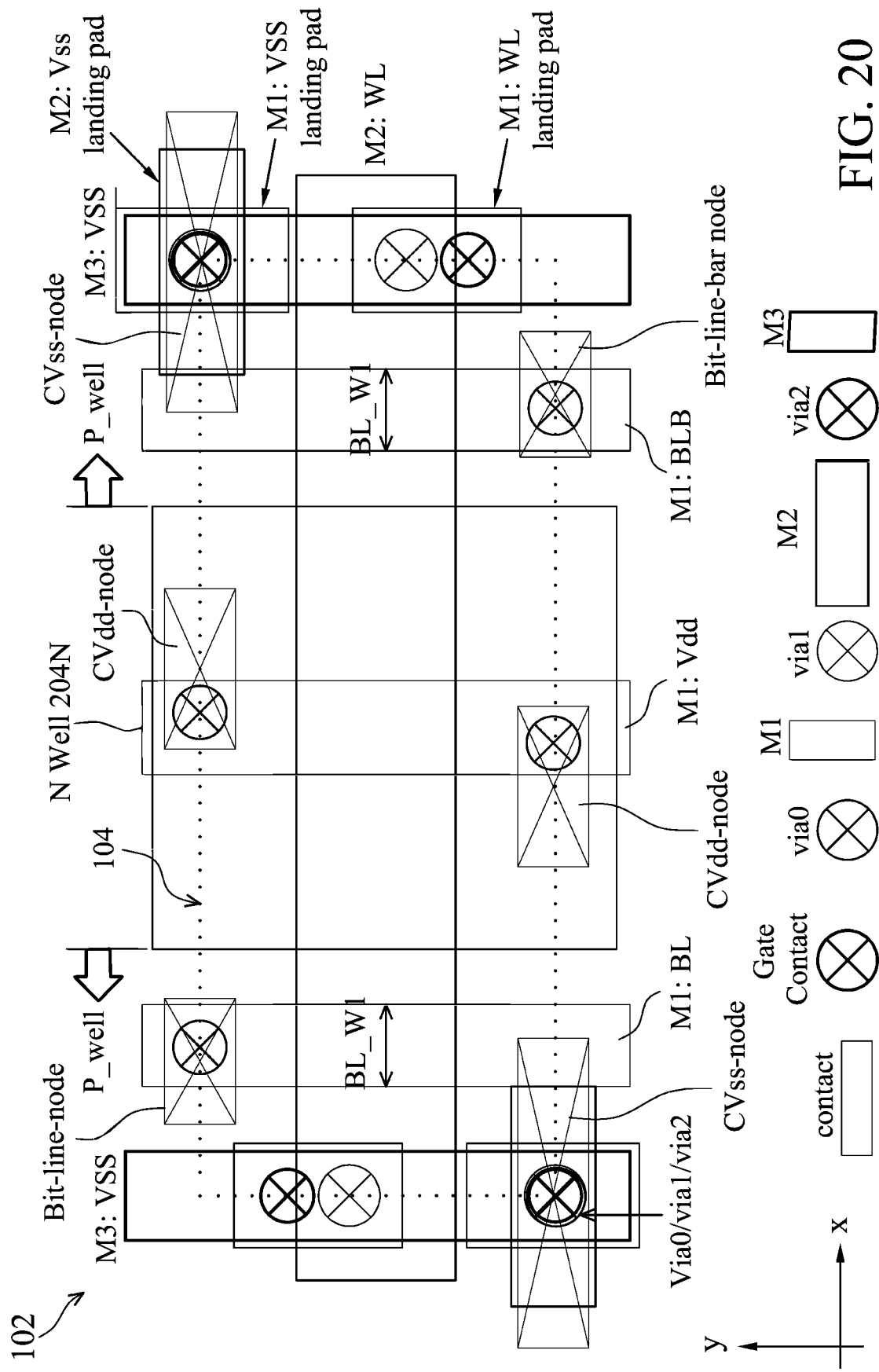
Figure 21:
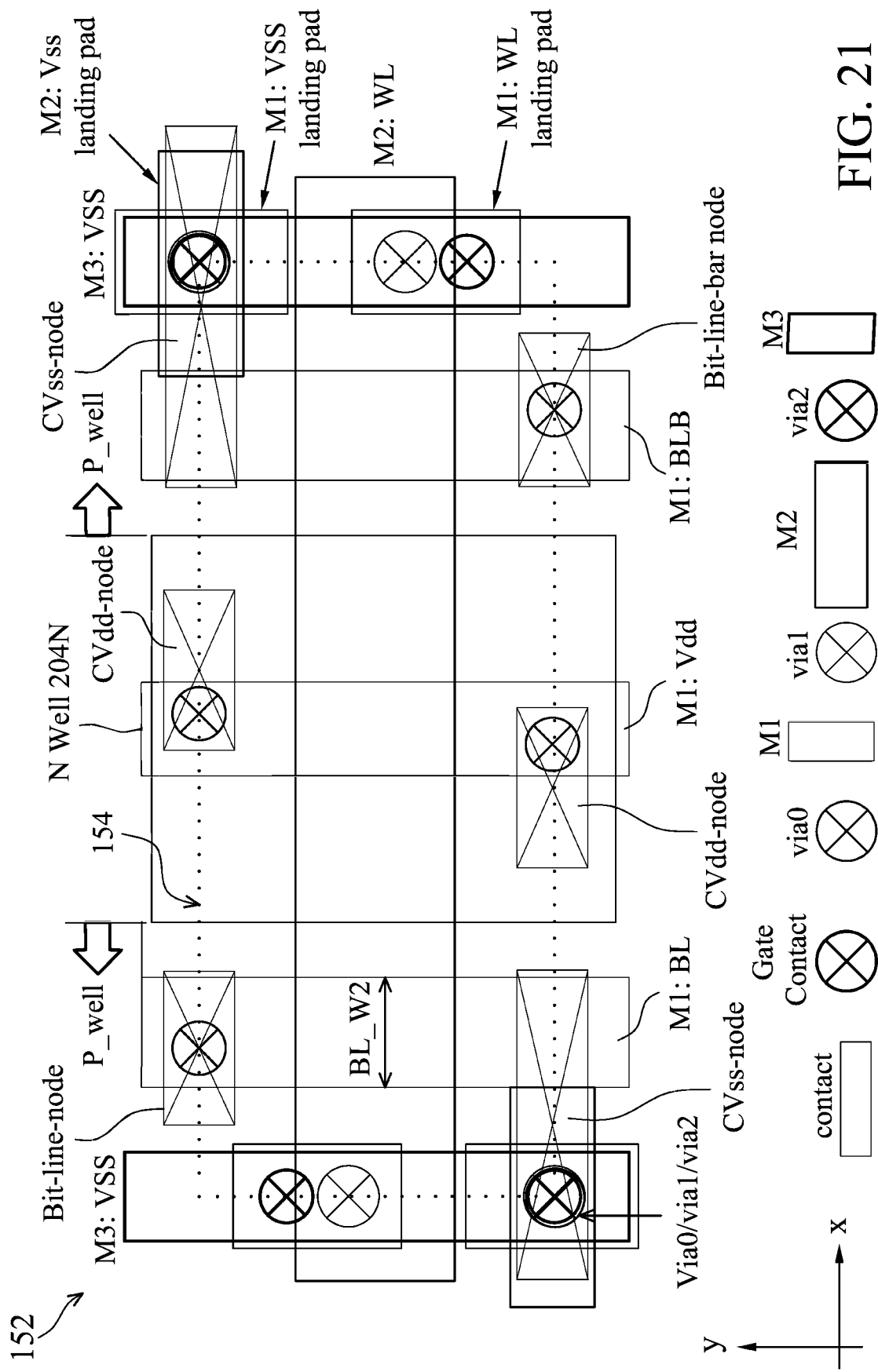

FIG. 20 shows a layout of certain metal layers of the HD SRAM macro 102 shown in FIG. 12. FIG. 21 shows a layout of certain metal layers of the HC SRAM macro 152 shown in FIG. 17. The features in FIGS. 20 and 21 are substantially the same as those in FIGS. 10 and 11, respectively. Thus, the discussion of them are omitted herein. As shown in FIG. 20, the bit line conductors (BL and BLB) in the M1 layer have a width BL_W1 along the "x" direction. As shown in FIG. 21, the bit line conductors (BL and BLB) in the M1 layer have a width BL_W2 along the "x" direction. In the present embodiment, the bit line conductors of the HC SRAM macro 152 are wider than the bit line conductors of the HD SRAM macro 102 (i.e., BL_W2>BL_W1) so that higher current can be conducted through the bit line conductors in the HC SRAM macro 152 while reducing voltage drop during read and write operations. In some embodiments, a ratio of BL_W2 to BL_W1 is greater than 1.2. In some embodiments, a ratio of BL_W2 to BL_W1 is in a range of 1.1 to 2.

As discussed above, the HD SRAM cells 104 (either implemented with FinFET such as shown in FIGS. 2-6 or with GAA transistors such as shown in FIGS. 12-16) are designed to have high memory density, low leakage, and low power consumption. However, this comes at the expense of low write margin in some instances. In the present embodiment, a write-assist circuit (provided in the HD SRAM macro 102) is coupled to each HD SRAM cell 104 to improve the write margin thereof. Since the pull-down transistors and pass-gate transistors in the HC SRAM cells 154 have wider channels than their counterparts in the HD SRAM cells 104, the HC SRAM cells 154 do not need a write-assist circuit, and the HC SRAM macro 152 does not include a write-assist circuit.

Figure 22A:
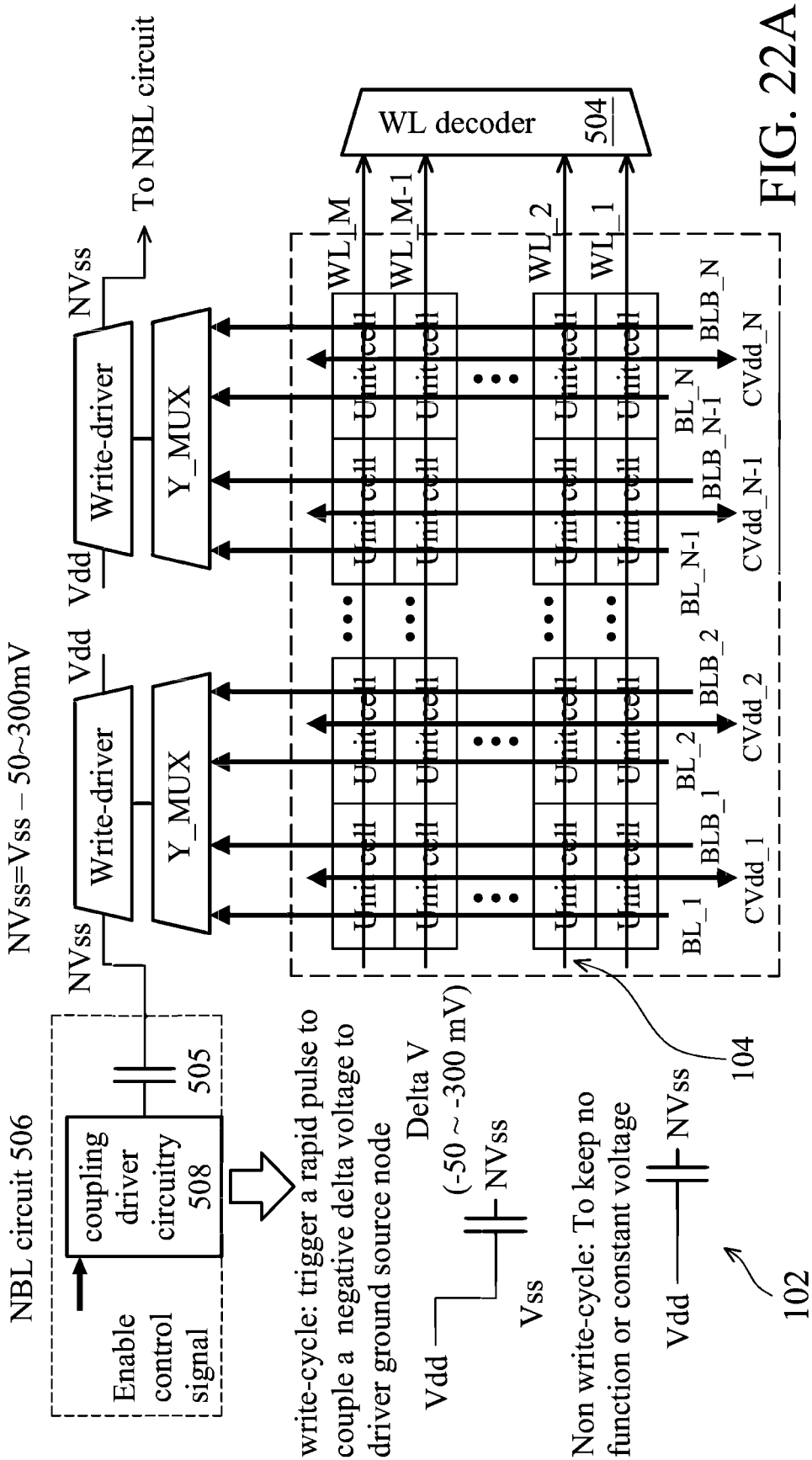
FIGS. 22A and 22B illustrate a write-assist circuit coupled to high-density memory cells such as those shown in FIG. 2 and FIG. 12, in accordance with an embodiment of the present disclosure.
Figure 22B:
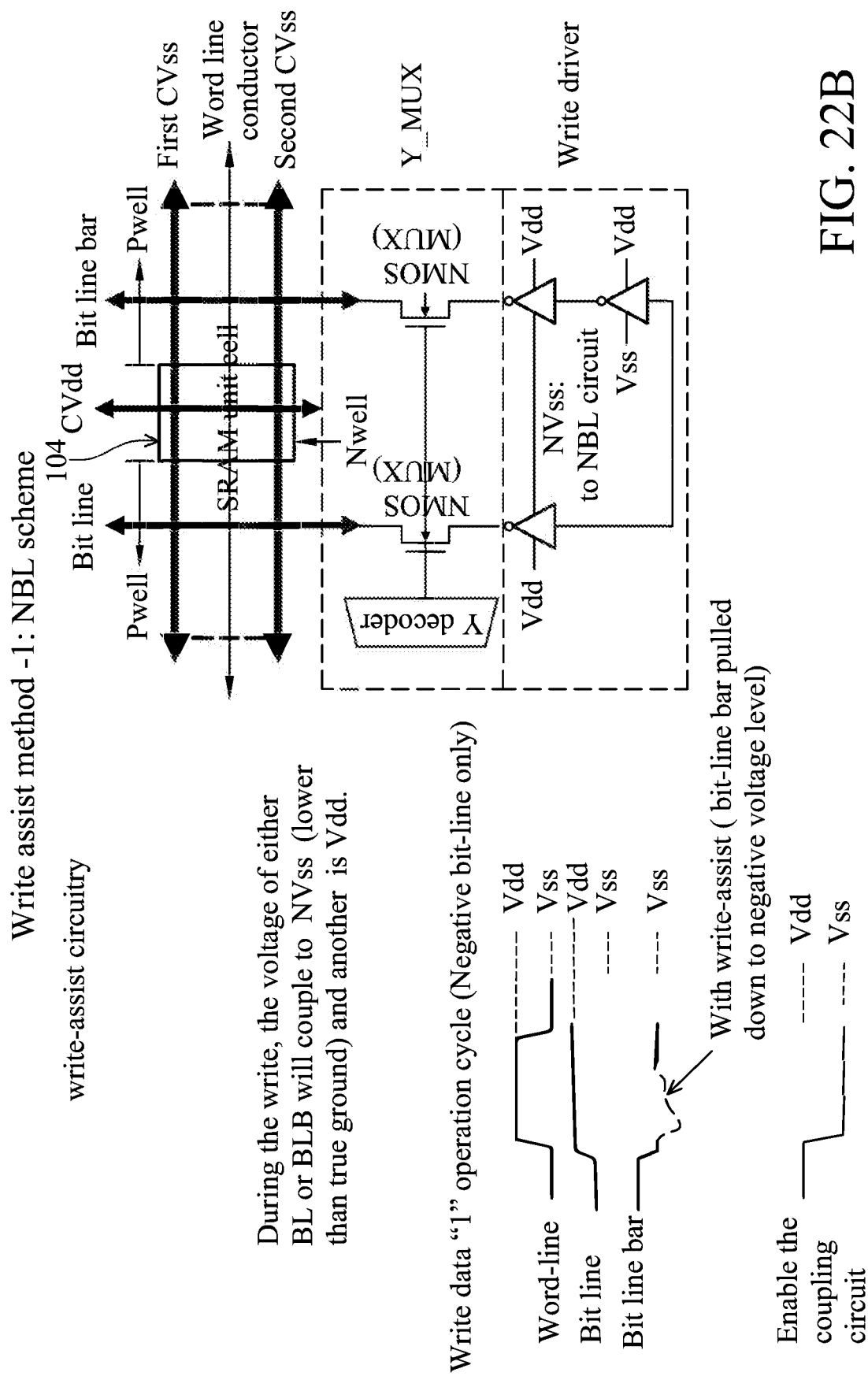

FIGS. 22A and 22B illustrate an embodiment of the write-assist circuit implemented in the HD SRAM macro 102, particularly, in the peripheral logic circuit of the HD SRAM macro 102. As shown in FIG. 22A, an array of HD SRAM cells 104 are provided (in the dashed box) and are labeled as "Unit cell." There are M rows and N columns of the HD SRAM cells 104 in the array, where M and N are integers. In some embodiments, M is an integer ranging from 1 to 512 and N is an integer ranging from 1 to 512. The N bit lines (BL and BLB) of the HD SRAM cells 104 are routed to multiplexer "Y_MUX" which are coupled to write drivers "Write-driver." The write drivers are coupled to a negative bias logic (NBL) circuit 506. The M word lines WL_1 through WL_M are routed to a word line decoder 504.

During a write operation, the NBL circuit 506 is configured to selectively adjust the voltage of the ground reference Vss. The NBL circuit 506 is a write-assist circuitry. The NBL circuit 506 comprises a negative voltage generator (e.g. coupling driver circuit 508) which is electrically connected to the bit lines BL and BLB of each cell of the plurality of HD SRAM cells 104 in the HD SRAM macro 102 through a capacitor 505.

NBL circuit 506 is configured to receive an input signal (e.g., enable control signal) which triggers the negative voltage generator (e.g. coupling driver circuit 508) to selectively adjust the write driver ground reference voltage Vss. In some embodiments, during a write cycle of the HD SRAM macro 102, the bit line BL (or the bit line bar BLB) is discharged to a low voltage (Vss) state, and the bit line bar BLB (or the bit line BL) is pre-charged to a high voltage (Vdd) state, and the negative voltage generator is configured to reduce the bit line voltage lower than the low voltage state (e.g., Vss) (i.e., NVss is lower than Vss), if the negative voltage generator is enabled by the control signal. The ground source node NVss is coupled to either the bit-line or the bit-line bar through the multiplexers Y_MUX.

In some embodiments, during a write operation of a selected memory cell, the NBL circuit 506 is configured to connect the ground source node (NVss) of the write driver Write-driver to a negative voltage. In some embodiments, the negative voltage NVss is lower than a ground reference (Vss). In some embodiments, the negative voltage NVss is lower than the ground reference (Vss) by a first range. In some embodiments, the first range ranges from 50 millivolts (mV) to 300 mV.

In some embodiments, the ground source node (NVss) of the write driver Write-driver is electrically connected to a reset or zeroing circuit (not shown), which is configured to selectively reset the voltage of the ground source node (NVss). In some embodiments, the reset or zeroing circuit comprises an NMOS transistor, where the source is connected to ground, and the gate is connected to a reset signal, which switches the NMOS transistor on and off.

FIG. 22B illustrates more details about the Y_MUX and the write driver of FIG. 22A. FIG. 22B shows an HD SRAM cell 104 whose bit line and bit line bar are connected to the Y_MUX. The Y_MUX includes a Y decoder (or column decoder) (for selecting a memory cell's bit line and bit line bar) and two NMOS gates. The write driver circuit includes inverters whose outputs are coupled to the source (or drain) of the NMOS transistors in the Y_MUX.

FIG. 22B also shows a waveform diagram of various signals of the HD SRAM macro 102 including the word line, bit line, bit line bar, and the enable control signal to NBL circuit 506. As illustrated, in some embodiments, during a write operation, a high to low transition triggers the coupling driver circuit 508 to generate a rapid pulse to capacitor 505 and provides a negative delta voltage to Vss node, the voltage of the bit line bar BLB is coupled to a voltage that is lower than true ground (e.g., NVss), and the voltage of the bit line BL remains at a logically high level Vdd. In some embodiments, during a write operation, a high to low transition triggers the coupling driver circuit 508 to generate a rapid pulse to capacitor 505 and provides a negative delta voltage to Vss node, the voltage of the bit line BL is coupled to a voltage that is lower than true ground (e.g., NVss), and the voltage of the bit line bar BLB remains at a logically high level Vdd. Although FIG. 22B illustrates the bit line BL is pre-charged to high and the bit line bar BLB is discharged towards Vss, in some embodiments, the bit line bar BLB is pre-charged to high and the bit line BL is discharged towards Vss.

Figures 23A, 23B:
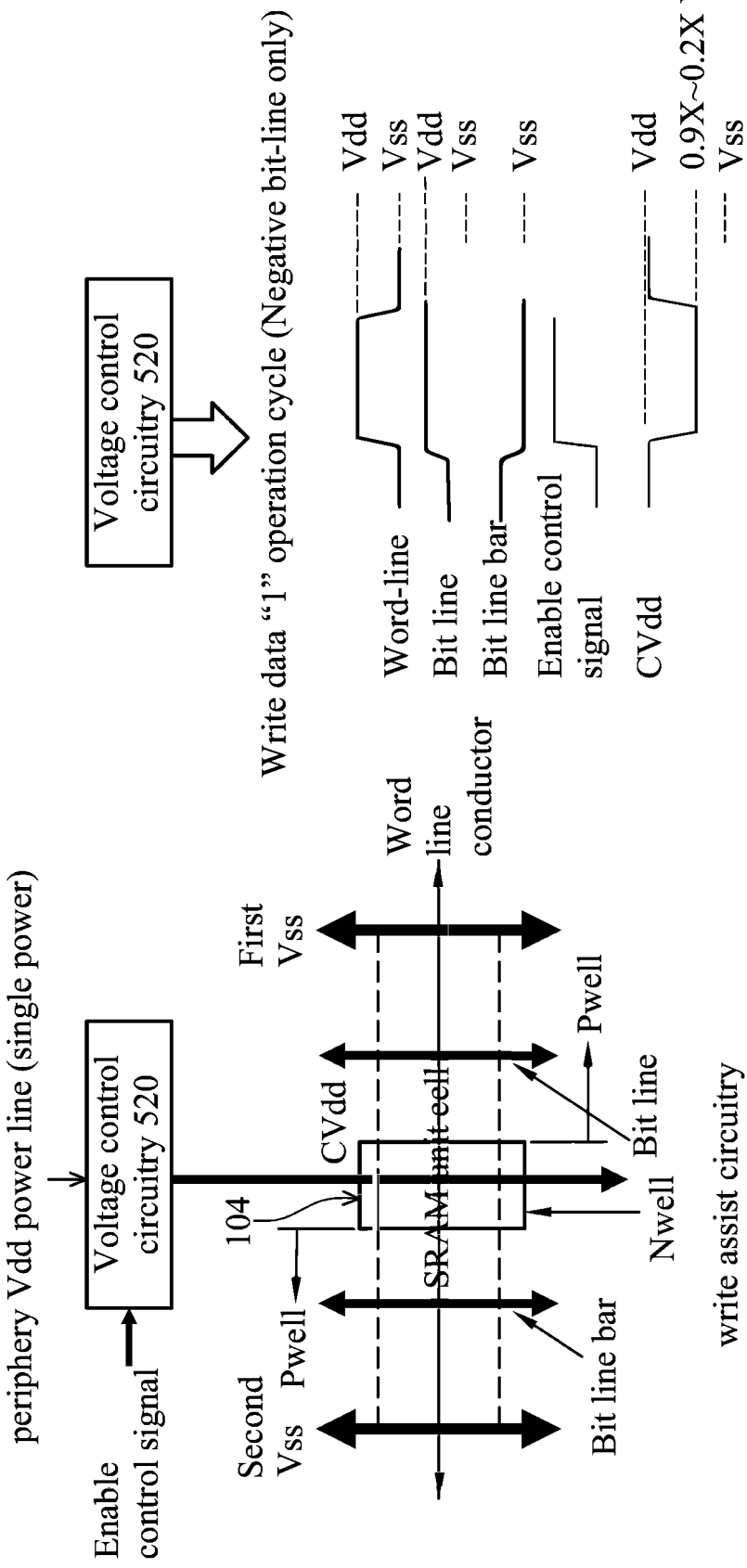
FIGS. 23A and 23B illustrate a write-assist circuit coupled to high-density memory cells such as those shown in FIG. 2 and FIG. 12, in accordance with another embodiment of the present disclosure.

FIGS. 23A and 23B illustrate another embodiment of the write-assist circuit implemented in the HD SRAM macro 102, particularly, in the peripheral logic circuit of the HD SRAM macro 102. FIG. 23A illustrates an HD SRAM cell 104 whose positive power supply CVdd is coupled to a voltage control circuitry 520. Voltage control circuit 520 is configured to receive an input signal (e.g., enable control signal) which triggers voltage control circuit 520 to selectively adjust the reference voltage CVdd provided to the HD SRAM cell 104. Referring to FIG. 23B, during a write operation of a selected HD SRAM cell 104, the voltage control circuit 520 is configured to reduce a voltage of the CVdd line of the selected HD SRAM cell 104 to a predetermined voltage, where the predetermined voltage ranges from 90% to 20% of Vdd. Although FIG. 23B illustrates the bit line BL is pre-charged to high and the bit line bar BLB is discharged to Vss, in some embodiments, the bit line bar BLB is pre-charged to high and the bit line BL is discharged to Vss.

Figure 24A:
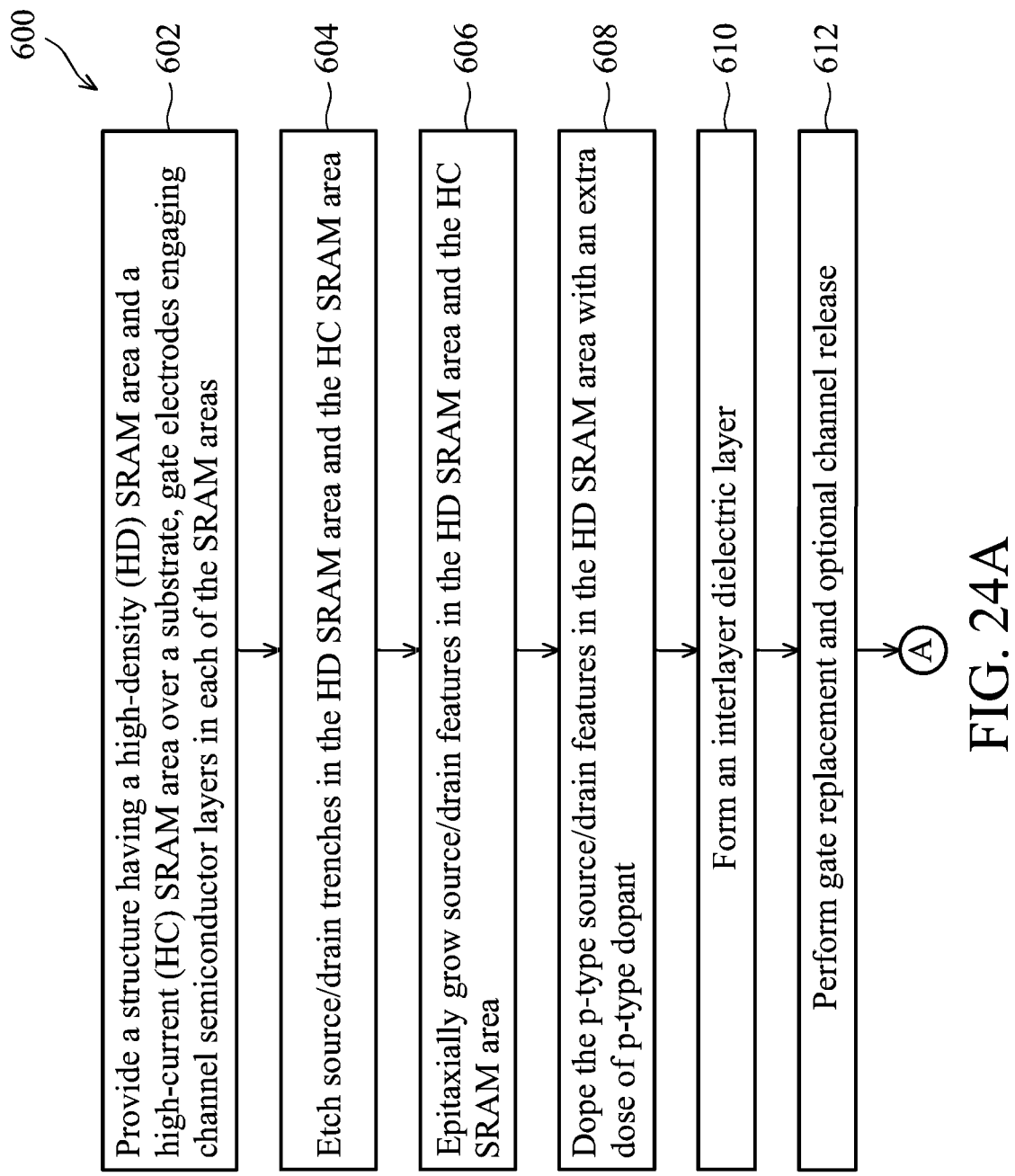
FIGS. 24A and 24B illustrate a flow chart of a method of forming an integrated circuit device such as the device shown in FIG. 1A, in accordance with an embodiment of the present disclosure.
Figure 24B:
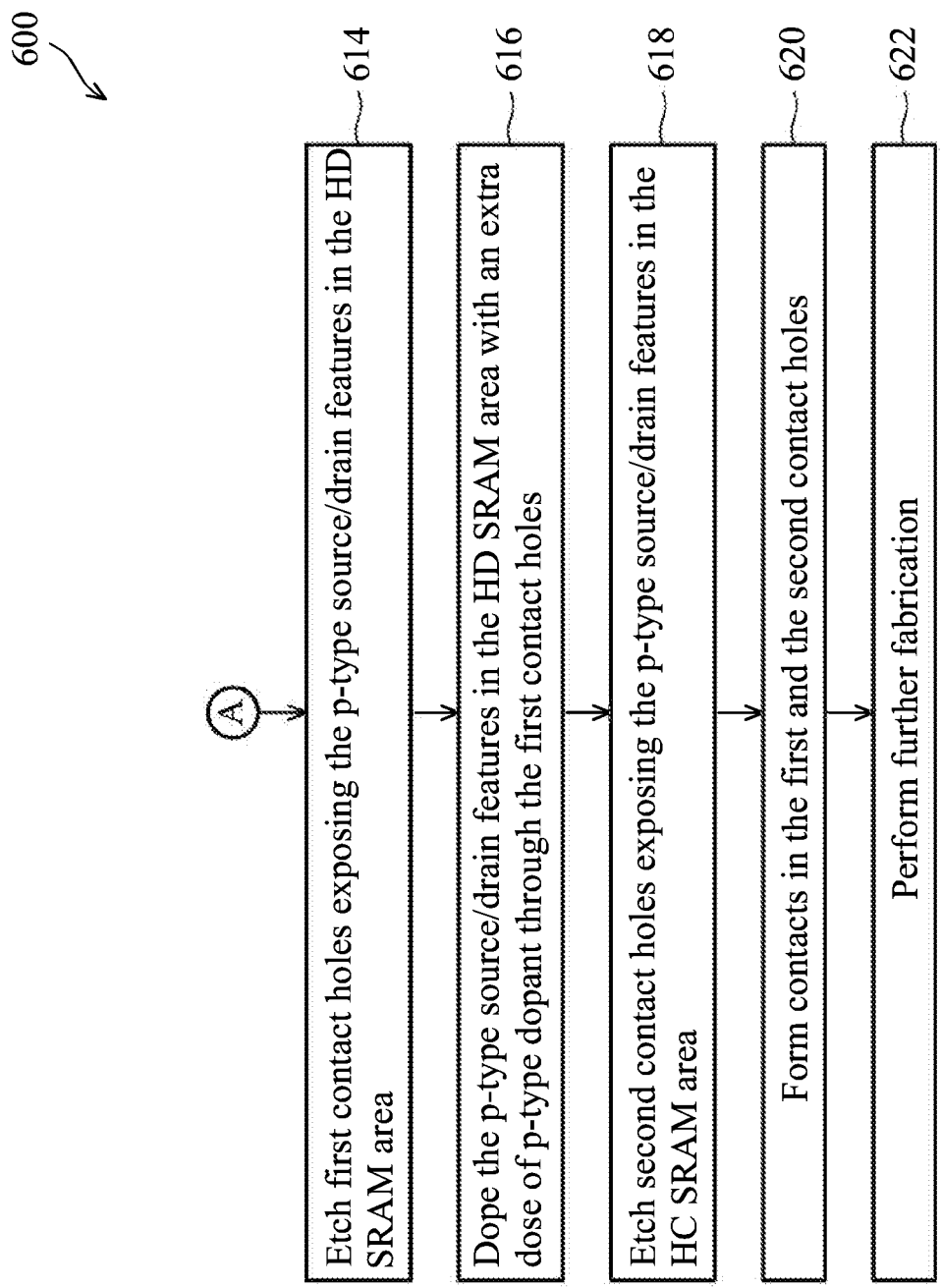

FIGS. 24A and 24B show a flow chart of a method 600 for fabricating a device with both HD SRAM and HC SRAM, such as the device 200 (FIG. 1A), according to various aspects of the present disclosure. Method 600 is described below in conjunction with FIGS. 25A-31C, which illustrate top and cross-sectional views of the device 200 implemented with GAA transistors according to an embodiment similar to those illustrated in FIGS. 12-21. Those skilled in the art should appreciate that the method 600 can be similarly used to form a device 200 implemented with FinFET transistors according to an embodiment similar to those illustrated in FIGS. 2-11. Additional processing is contemplated by the present disclosure. Additional steps can be provided before, during, and after method 600, and some of the steps described can be moved, replaced, or eliminated for additional embodiments of method 600.

At operation 602, the method 600 (FIG. 24A) provides or is provided with a device 200 having a substrate 202 and various features formed in or on the substrate 202, such as shown in FIGS. 25A, 25B, and 25C. For example, the device 200 includes N wells 204N and P wells 204P. The device 200 further includes fins 211. Each fin 211 includes semiconductor layers 210 and semiconductor layers 215 stacked vertically in an alternating or interleaving configuration from the top surface of the substrate 202. The topmost semiconductor layer 215 is labeled as 215a for convenience of discussion. In some embodiments, semiconductor layers 210 and semiconductor layers 215 are epitaxially grown in the depicted interleaving and alternating configuration. A composition of semiconductor layers 210 is different than a composition of semiconductor layers 215 to achieve etching selectivity and/or different oxidation rates during subsequent processing. For example, the semiconductor layers 215 and 210 may include silicon and silicon germanium, respectively. The fins 211 may be patterned by any suitable method including double-patterning or multi-patterning processes. The device 200 further includes isolation features 230. The device 200 further includes sacrificial gate stacks 240' engaging the fins 211 and gate spacers 247 on sidewalls of the sacrificial gate stacks 240'. The sacrificial gate stack 240' includes a sacrificial gate dielectric layer 246 and a sacrificial gate electrode layer 245. The sacrificial gate dielectric layer 246 is formed on top and sidewalls of the fins 211 and the sacrificial gate electrode layer 245 is formed on the sacrificial gate dielectric layer 246. In embodiments, the sacrificial gate dielectric layer 246 may include a dielectric material, such as silicon oxide, silicon oxynitride, a high-k dielectric material, other suitable dielectric material, or combinations thereof; and the sacrificial gate electrode layer 245 includes a suitable dummy gate material, such as polysilicon layer. The sacrificial gate electrode layer 245 and the sacrificial gate dielectric layer 246 may be deposited using CVD, PVD, ALD, other suitable methods, or combinations thereof. In the present embodiment, the device 200 includes an area defined (or allocated) for HD SRAM cells 104 (referred to as HD SRAM area) and another area defined (or allocated) for HC SRAM cells 154 (referred to as HC SRAM area). The various features above are provided in both areas. For embodiments implemented with FinFET, the fins 211 may include a single material or multiple materials and may or may not have the semiconductor layer stack.

Figure 26A:
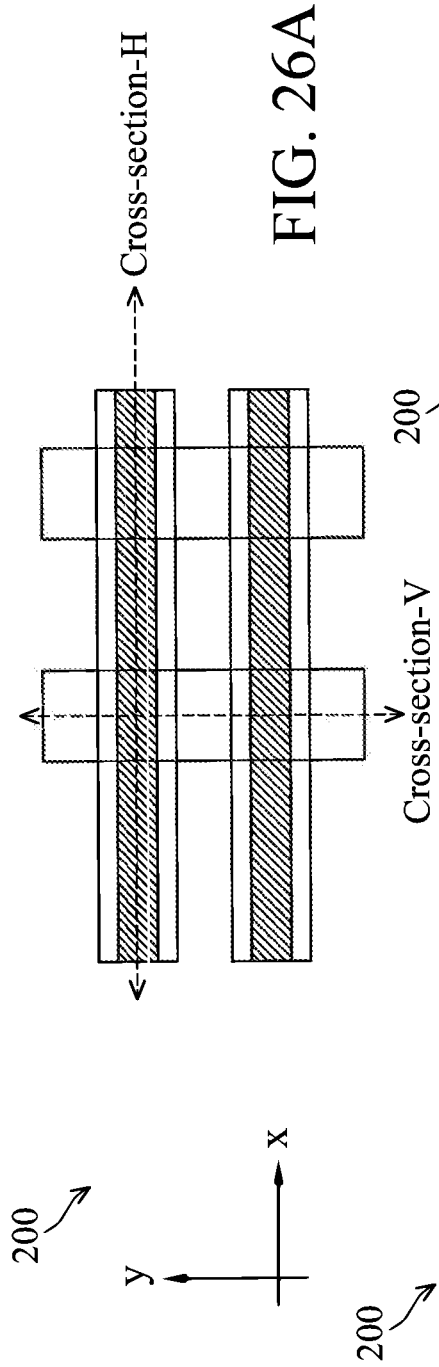
Figure 26C:
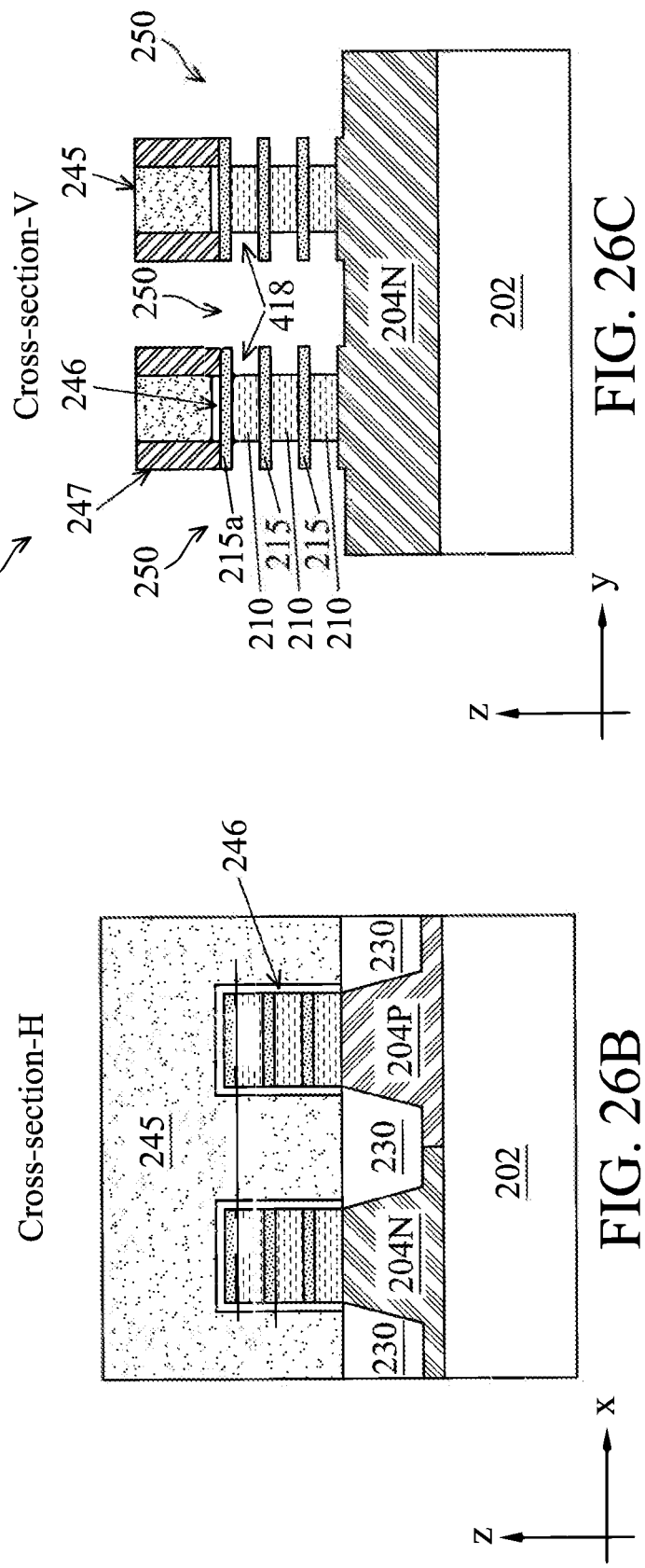
Figure 26B:
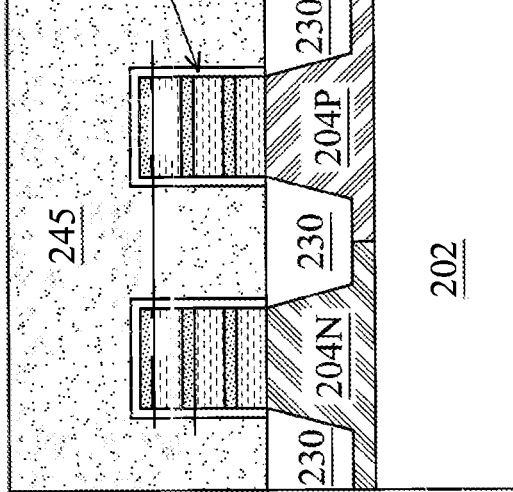

At operation 604, the method 600 (FIG. 24A) etches the fins 211 adjacent the gate spacers 247 to form S/D trenches (or recesses) 250, such as shown in FIGS. 26A, 26B, and 26C. In an embodiment, the S/D trenches 250 are formed in both the HD SRAM area and the HC SRAM area. For example, an etching process may completely remove the fins 211 in the source/drain regions and may further etch the wells 204P/N in the source/drain regions. The etching process can include a dry etching process, a wet etching process, other suitable etching process, or combinations thereof. In some embodiments, parameters of the etching process are configured to selectively etch the fins 211 with minimal (to no) etching of the gate stacks 240', the gate spacers 247, and the isolation features 230. The operation 604 also forms gaps 418 between the semiconductor layers 215. For example, an etching process is performed that selectively etches semiconductor layers 210 exposed by source/drain trenches 250 with minimal (to no) etching of semiconductor layers 215, such that gaps 418 are formed between semiconductor layers 215 and between semiconductor layers 215 and wells 204P/N under the gate spacers 247. For embodiments implemented with FinFET, the operation 604 does not form the gaps 418.

Figure 27A:
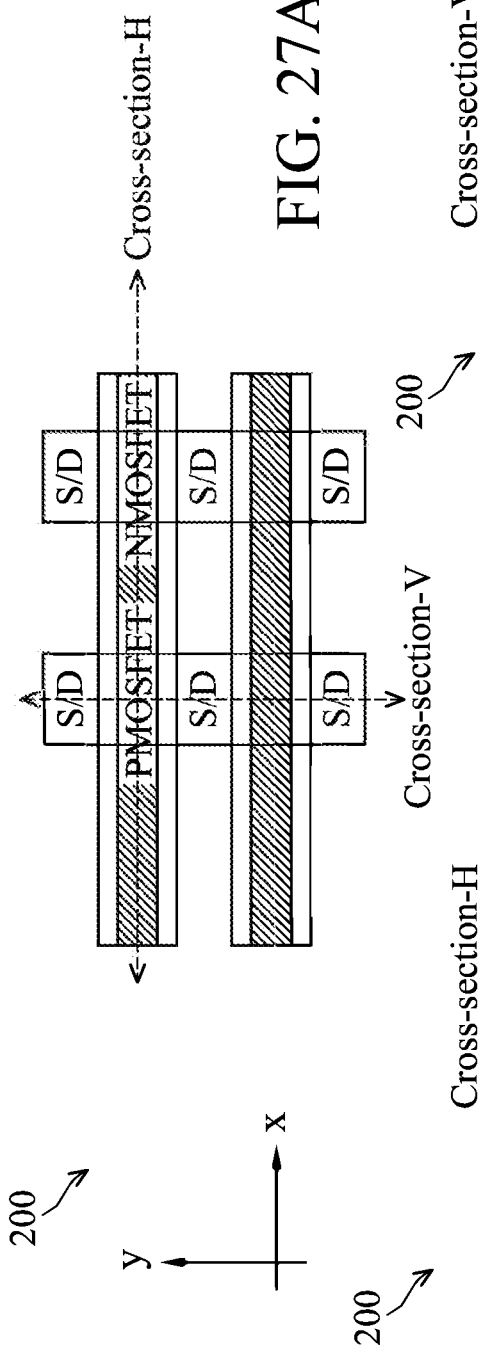
Figure 27C:
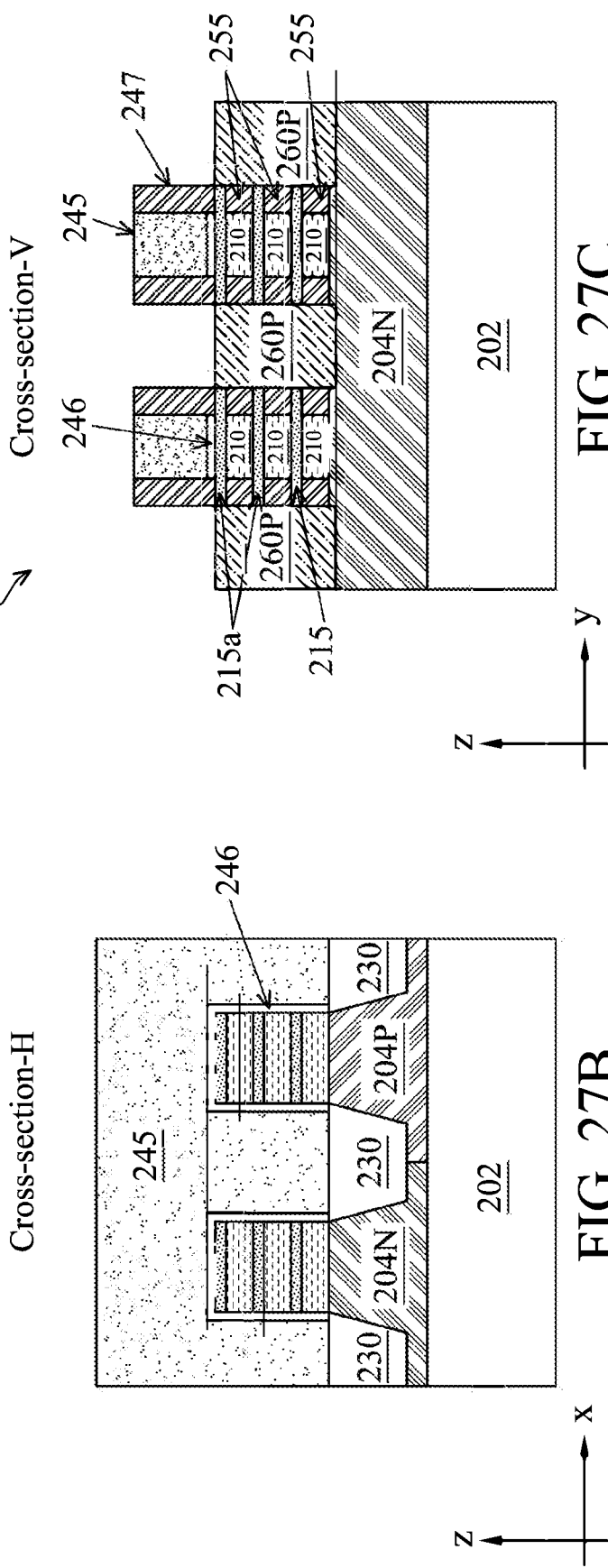
Figure 27B:
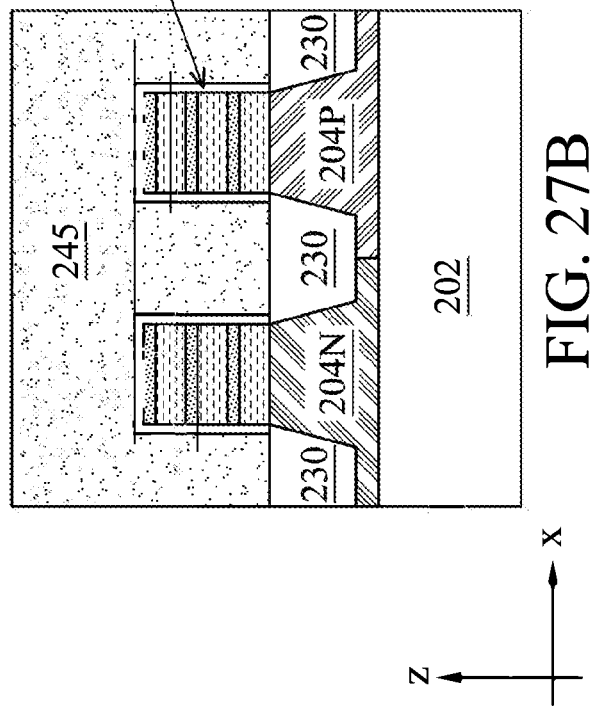

At operation 606, the method 600 (FIG. 24A) forms the inner spacers 255 in the gaps 418 and epitaxially grows the S/D features 260N/P, such as shown in FIGS. 27A, 27B, and 27C. For example, a deposition process forms a spacer layer over the gate structures 240' and over features defining the source/drain trenches 250. The deposition process may be CVD, PVD, ALD, other suitable methods, or combinations thereof. The spacer layer partially (and, in some embodiments, completely) fills the source/drain trenches 250. The deposition process is configured to ensure that the spacer layer fills the gaps 418. An etching process is then performed that selectively etches the spacer layer to form inner spacers 255 with minimal (to no) etching of semiconductor layers 215, gate stacks 240', and gate spacers 247. The spacer layer (and thus inner spacers 255) includes a material that is different than a material of semiconductor layers 215 and a material of gate spacers 247 to achieve desired etching selectivity during the second etching process. For embodiments implemented with FinFET, the operation 606 does not form the inner spacers 255. Then, the operation 606 forms the S/D features 260N and 260P using epitaxial growth processes. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and the semiconductor layers 215. In some embodiments, the epitaxial source/drain features 260N may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260P may include silicon germanium or germanium and may be doped with boron, other p-type dopant, or combinations thereof (for example, forming Si:Ge:B epitaxial source/drain features). In some embodiments, epitaxial source/drain features 260P and/or 260N include more than one epitaxial semiconductor layer, where the epitaxial semiconductor layers can include the same or different materials and/or dopant concentrations. In some embodiments, epitaxial source/drain features 260P and 260N include materials and/or dopants that achieve desired tensile stress and/or compressive stress in respective channel regions of the transistors. In some embodiments, epitaxial source/drain features 260P and 260N are doped during deposition by adding impurities to a source material of the epitaxy process (i.e., in-situ). In some embodiments, epitaxial source/drain features 260P and 260N are doped by an ion implantation process subsequent to a deposition process (i.e., ex-situ). In some embodiments, annealing processes (e.g., rapid thermal annealing (RTA) and/or laser annealing) are performed to activate dopants in epitaxial source/drain features 260P and 260N and/or other source/drain regions (for example, heavily doped source/drain regions and/or lightly doped source/drain (LDD) regions).

In some embodiments, epitaxial source/drain features 260P and 260N are formed in separate processing sequences that include, for example, masking p-type transistor regions when forming epitaxial source/drain features 260N in n-type transistor regions and masking n-type transistor regions when forming epitaxial source/drain features 260P in p-type transistor regions. In an embodiment, the operation 606 forms the source/drain features 260N simultaneously in the HD SRAM area and the HC SRAM area, and forms the source/drain features 260P simultaneously in the HD SRAM area and the HC SRAM area. To further this embodiment, the operation 606 dopes the source/drain features 260N in the HD SRAM cells 104 and the HC SRAM cells 154 with the same dose of n-type dopant(s) and dopes the source/drain features 260P in the HD SRAM cells 104 and the HC SRAM cells 154 with the same dose of p-type dopant(s). Thus, the source/drain features 260N in the HD SRAM cells 104 and the HC SRAM cells 154 are formed with the same or substantially the same n-type dopant concentration (such as phosphorus concentration), and the source/drain features 260P in the HD SRAM cells 104 and the HC SRAM cells 154 are formed with the same or substantially the same p-type dopant concentration (such as boron concentration). In an alternative embodiment, the operation 606 may form the source/drain features 260N separately in the HD SRAM cells 104 and the HC SRAM cells 154 and form the source/drain features 260P separately in the HD SRAM cells 104 and the HC SRAM cells 154.

At operation 608, the method 600 (FIG. 24A) dopes the source/drain features 260P in the HD SRAM cells 104 with an extra dose of p-type dopant(s), such as boron. In an embodiment, this ensures that the source/drain features 260P in the HD SRAM cells 104 has a higher p-type dopant (such as boron) concentration than the source/drain features 260P in the HC SRAM cells 154. In an embodiment, the operation 608 forms an ion implantation mask 192 (see FIG. 2 and FIG. 12) over the device 200. The mask 192 exposes the source/drain features 260P in the HD SRAM cells 104 and covers the rest of the device 200 (or at least covers the source/drain features 260P in the HC SRAM cells 154). Then, the operation 608 performs one or more ion implantation processes to the device 200 through the mask 192, thereby doping the source/drain features 260P in the HD SRAM cells 104 with an extra dose of p-type dopants, such as boron. In some embodiments, the mask 192 includes a patterned photoresist (or resist). In some embodiments, the mask 192 further includes an anti-reflective coating (ARC) layer or other layer(s) under the patterned resist. In some embodiments, the mask 192 is formed by a photolithography process that includes spin-coating a resist layer, performing a pre-exposure baking process, performing an exposure process using a photomask, performing a post-exposure baking process, and performing a developing process. After development, the resist layer is patterned into the mask 192 that corresponds with the photomask. Alternatively, the exposure process can be implemented or replaced by other methods, such as maskless lithography, e-beam writing, ion-beam writing, or combinations thereof. After the ion implantation processes finish, the operation 608 removes the mask 192 from the device 200, for example, using resist stripping, ashing, or other suitable methods. In an embodiment, after performing the ion implantation, the operation 608 performs an annealing process to activate the dopants. In some embodiments, the method 600 omits (or skips) the operation 608, and performs the operation 616 to dope the source/drain features 260P in the HD SRAM cells 104 with an extra dose of p-type dopants (such as boron), which will be discussed later.

Figures 28A, 28B, 28C:
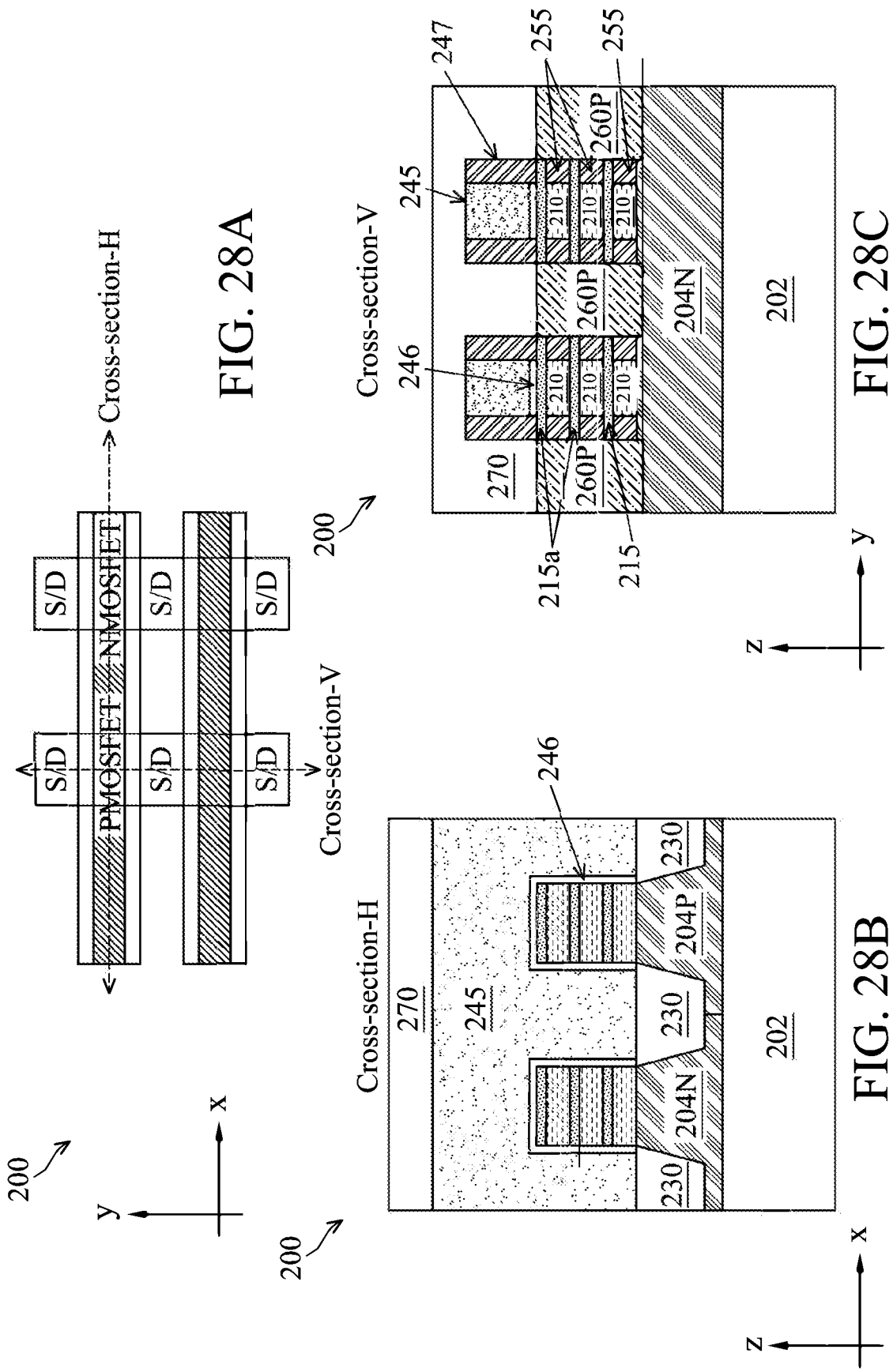

At operation 610, the method 600 (FIG. 24A) forms a contact etch stop layer (CESL) (not shown) over the S/D features 260N and 260P and the gate structures 240' and form an ILD layer 270 over the CESL, such as shown in FIGS. 28A, 28B, and 28C. The CESL may include $La_2O_3$, $Al_2O_3$, SiOCN, SiOC, SiCN, $SiO_2$, SiC, ZnO, ZrN, Zr$_2$Al$_3$O$_9$, TiO$_2$, TaO$_2$, ZrO$_2$, HfO$_2$, Si$_3$N$_4$, Y$_2$O$_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

Figures 29A, 29B, 29C:
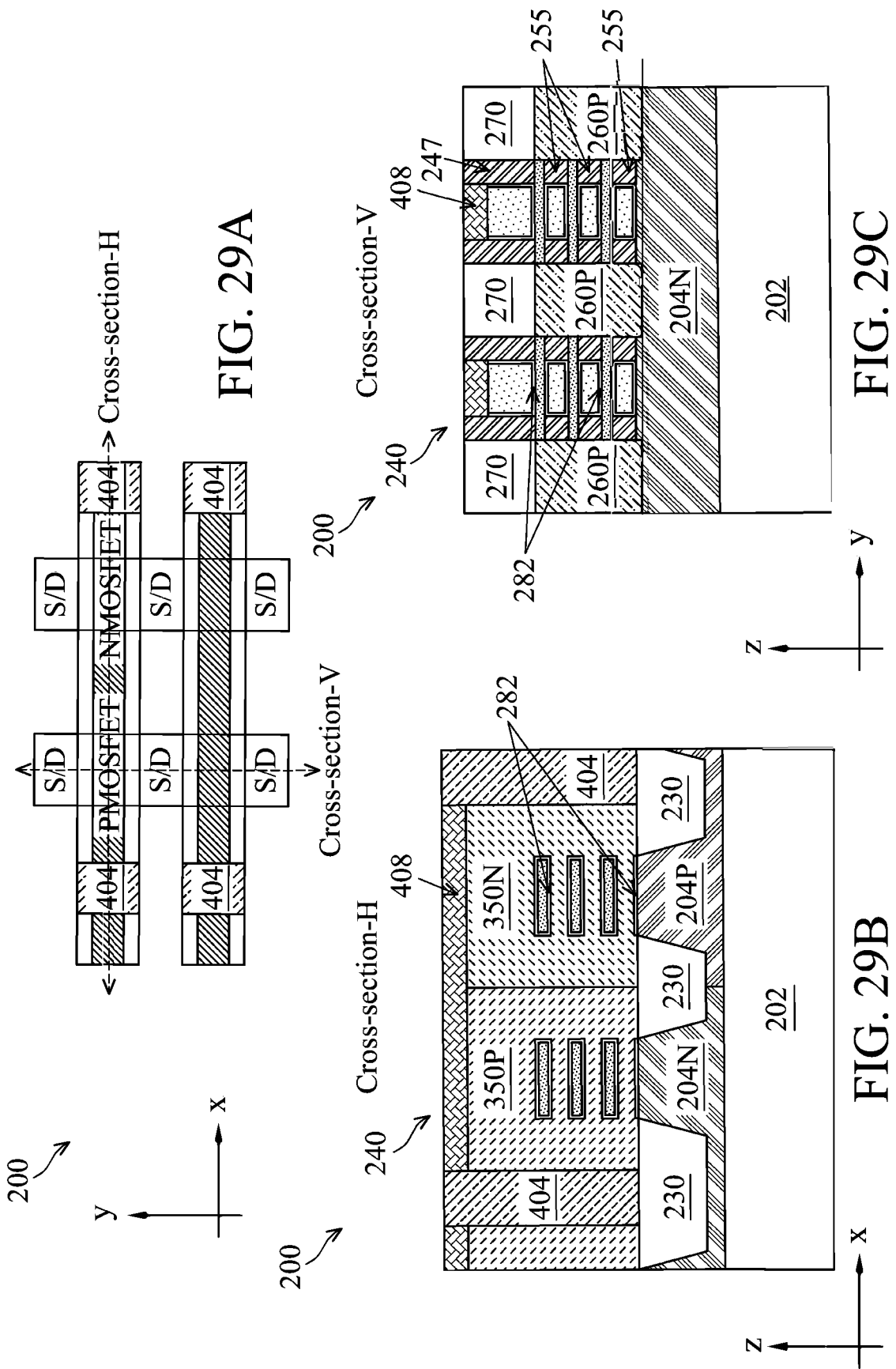

At operation 612, the method 600 (FIG. 24A) replaces the sacrificial gate structures 240' with high-k metal gate stacks 240, such as shown in FIGS. 29A, 29B, and 29C. This involves a variety of processes including etching and deposition. For example, the operation 612 removes the gate structures 240' to form gate trenches, removes the semiconductor layers 210 exposed in the gate trenches (also referred to as channel release), and deposits the high-k metal gate stacks 240 (including the gate dielectric layer 282 and the gate electrodes 350) in the gate trenches and wrapping around each of the semiconductor layers 215. The gate structures 240' and the semiconductor layers 210 may be removed by one or more etching processes that may include a dry etching process, a wet etching process, other suitable etching process, or combinations thereof. The gate dielectric layer 282 may be formed using chemical oxidation, thermal oxidation, ALD, CVD, and/or other suitable methods. The gate electrode 350 (including work function metal layer(s) and a low resistance metal fill layer) may be formed using ALD, CVD, PVD, plating, and/or other suitable processes. Subsequently, the operation 612 forms the gate-top dielectric layer 408 over each of the gate stacks 240. The gate-top dielectric layer 408 may be formed by recessing the gate stacks 240 and the gate spacers 247 to form trenches, filling the trenches with one or more dielectric materials, and performing a CMP process to remove excessive dielectric materials.

At operation 614, the method 600 (FIG. 24B) etches contact holes 405 through the ILD 270 and the CESL, thereby exposing the source/drain features 260P in the HD SRAM cells 104, such as shown in FIGS. 30A, 30B, and 30C. In an embodiment, the contact holes 405 are formed while the source/drain features 260P in the HC SRAM cells 154 as well as the source/drain features 260N in both the HD SRAM cells 104 and the HC SRAM cells 154 are still covered by the CESL and the ILD 270. In an embodiment, the operation 614 forms an etch mask (not shown) over the device 200. The etch mask provides openings directly above the source/drain features 260P in the HD SRAM cells 104 and covers the rest of the device 200. Then, the operation 614 performs one or more etching processes to etch through the ILD 270 and the underlying CESL (and any other materials), thereby exposing the source/drain features 260P in the HD SRAM cells 104. The etch mask may be formed using similar processes that form the ion implantation mask 192.

At operation 616, the method 600 (FIG. 24B) performs one or more ion implantation processes to the device 200, thereby doping the source/drain features 260P in the HD SRAM cells 104 with an extra dose of p-type dopants (such as boron) through the contact holes 405. In an embodiment, the operation 616 performs the ion implantation processes with the etch mask formed in the operation 614 still over the device 200 and removes the etch mask after the ion implantation processes finish. In an alternative embodiment, the operation 616 removes the etch mask formed in the operation 614 and then performs the ion implantation processes. In an embodiment, the ion implantation processes in the operation 616 are substantially the same as the ion implantation processes described in the operation 608. In an embodiment, the method 600 performs both the operation 608 and the operation 616. In another embodiment, the method 600 performs the operation 608 but does not perform the operation 616. In yet another embodiment, the method 600 performs the operation 616 but does not perform the operation 608. Using either or both of the operations 608 and 616, the method 600 dopes the source/drain features 260P in the HD SRAM cells 104 with an extra dose of p-type dopant(s) (such as boron) than the source/drain features 260P in the HC SRAM cells 154. In an embodiment, this ensures that the source/drain features 260P in the HD SRAM cells 104 have a higher p-type dopant (such as boron) concentration than the source/drain features 260P in the HC SRAM cells 154. In an embodiment, the boron dopant concentration in the source/drain features 260P of the HC SRAM cells 154 is in a range of about 1E19 atoms/cm$^3$ to about 6E20 atoms/cm$^3$ and the boron dopant concentration in the source/drain features 260P of the HD SRAM cells 104 is about two to five times higher than that in the source/drain features 260P in the HC SRAM cells 154. To further this embodiment, the operation 606 introduces about the same level of dopant concentration in the source/drain features 260P of the HC SRAM cells 154 and the HD SRAM cells 104, and the operations 608 and 616 collectively (if both are performed) or either one of the operations 608 and 616 (if only one of them is performed) introduces an additional dopant concentration in the source/drain features 260P of the HD SRAM cells 104 that is about one to four times of the dopant concentration introduced by the operation 606. In an embodiment, after performing the ion implantation, the operation 616 performs an annealing process to activate the dopants.

At operation 618, the method 600 (FIG. 24B) etches contact holes 405 through the ILD 270 and the CESL, thereby exposing the source/drain features 260P in the HC SRAM cells 154 and the source/drain features 260N in both the HD SRAM cells 104 and the HC SRAM cells 154. In an embodiment, the operation 618 forms an etch mask (not shown) over the device 200. The etch mask provides openings directly above the source/drain features 260P in the HC SRAM cells 154 and the source/drain features 260N in both the HD SRAM cells 104 and the HC SRAM cells 154, while covering the rest of the device 200. Then, the operation 618 performs one or more etching processes to etch through the ILD 270 and the underlying CESL (and any other materials), thereby exposing the source/drain features 260P in the HC SRAM cells 154 and the source/drain features 260N in both the HD SRAM cells 104 and the HC SRAM cells 154. The etch mask may be formed using similar processes that form the ion implantation mask 192 and may be removed after the contact holes 405 are etched.

At operation 620, the method 600 (FIG. 24B) forms silicide features 261 and contacts 406 in the contact holes 405 and electrically connected to the source/drain features 260N and 260P in both the HD SRAM cells 104 and the HC SRAM cells 154, such as shown in FIGS. 31A, 31B, and 31C. The silicide features 261 may be formed by depositing one or more metals over the source/drain features 260N and 260P, performing an annealing process to the device 200 to cause reaction between the one or more metals and the source/drain features 260N and 260P to produce the silicide features 261, and removing un-reacted portions of the one or more metals. The contacts 406 may be formed by CVD, PVD, ALD, plating, or other suitable processes.

At operation 622, the method 600 (FIG. 24B) performs further fabrication to the device 200. For example, the operation 622 may form various gate vias connected to the gate stacks 240, source/drain contact vias connected to the source/drain contacts 406, and the various metal features including the bit lines, the inverse bit lines, and the word lines.

Although not intended to be limiting, one or more embodiments of the present disclosure provide many benefits to a semiconductor device and the formation thereof. For example, embodiments of the present disclosure provide designs and layouts that use either FinFET or GAA devices to achieve both high-density SRAM and high-current SRAM in the same IC. High-density SRAM cells are provided with high alpha ratio for cell stability and are coupled with write-assist circuitry to improve write operations. High-current SRAM cells are provided with a low alpha ratio for write speed improvements. The above improvements are achieved by multiple factors. For example, the pass-gate devices and the pull-up devices are designed to have different number of fins (in the case of FinFET) or with different channel widths (in the case of GAA devices), and the source/drain features of the pull-up devices for the high-density SRAM are doped with additional p-type doping than those in the high-current SRAM. The present embodiments can be readily integrated into existing CMOS fabrication processes.

In one example aspect, the present disclosure is directed to a semiconductor structure. The semiconductor structure includes a substrate, an array of first SRAM cells over the substrate, and an array of second SRAM cells over the substrate. Each of the first SRAM cells includes two first p-type FinFET transistors and four first n-type FinFET transistors. Each of the first p-type FinFET transistors and the first n-type FinFET transistors includes a transistor channel in a single semiconductor fin and two source/drain regions connected by the transistor channel. The array of the first SRAM cells are arranged with a first X-pitch along a first direction and a first Y-pitch along a second direction perpendicular to the first direction. Each of the second SRAM cells includes two second p-type FinFET transistors and four second n-type FinFET transistors. Each of the second p-type FinFET transistors includes a transistor channel in a single semiconductor fin and two source/drain regions connected by the transistor channel. Each of the second n-type FinFET transistors includes a transistor channel in multiple semiconductor fins and two source/drain regions connected by the transistor channel. The array of the second SRAM cells are arranged with a second X-pitch along the first direction and a second Y-pitch along the second direction. The source/drain regions of the first p-type FinFET transistors have a higher boron dopant concentration than the source/drain regions of the second p-type FinFET transistors. A ratio of the second X-pitch to the first X-pitch is within a range of 1.1 to 1.5.

In an embodiment, the semiconductor structure further includes write-assist circuitry connected to each of the first SRAM cells, wherein the second SRAM cells are not connected to a write-assist circuitry. In another embodiment, the semiconductor structure further includes first power supply lines, first bit lines, and first inverse bit lines disposed in a first metal layer; first word lines disposed in a second metal layer over the first metal layer, wherein the first power supply lines, the first bit lines, the first inverse bit lines, and the first word lines are connected to the array of the first SRAM cells; second power supply lines, second bit lines, and second inverse bit lines disposed in the first metal layer; and second word lines disposed in the second metal layer, wherein the second power supply lines, the second bit lines, the second inverse bit lines, and the second word lines are connected to the array of the second SRAM cells, wherein the first bit line and the first inverse bit line have a first width, the second bit line and the second inverse bit line have a second width, and a ratio of the second width to the first width is greater than 1.1. In a further embodiment, the first bit line, the first inverse bit line, the second bit line, and the second inverse bit line are routed generally along the second direction, wherein the first word line and the second word line are routed generally along the first direction.

In an embodiment of the semiconductor structure, each of the first n-type FinFET transistors includes a first gate electrode having a first work-function metal layer, each of the second n-type FinFET transistors includes a second gate electrode having a second work-function metal layer, wherein the first and the second work-function metal layers include a same material, wherein the first work-function metal layer is thicker than the second work-function metal layer.

In an embodiment of the semiconductor structure, each of the first n-type FinFET transistors includes a first gate electrode having a first work-function metal layer, each of the first p-type FinFET transistors includes a second gate electrode having a second work-function metal layer, wherein the first and the second work-function metal layers include a same material. In a further embodiment, each of the second n-type FinFET transistors includes a third gate electrode having a third work-function metal layer, each of the second p-type FinFET transistors includes a fourth gate electrode having a fourth work-function metal layer, wherein the third and the fourth work-function metal layers include different materials. In another embodiment, the first n-type FinFET transistors have a higher threshold voltage than the second n-type FinFET transistors.

In another example aspect, the present disclosure is directed to a semiconductor structure. The semiconductor structure includes a substrate an array of first SRAM cells over the substrate, and an array of second SRAM cells over the substrate. Each of the first SRAM cells includes a first inverter having a first pull-up GAA transistor coupled to a first pull-down GAA transistor and a second inverter having a second pull-up GAA transistor coupled to a second pull-down GAA transistor. The first and the second inverters are cross-coupled to form first data storage nodes. Each of the first SRAM cells further includes first and second pass-gate GAA transistors for accessing the first data storage nodes. The array of the first SRAM cells are arranged with a first X-pitch along a first direction and a first Y-pitch along a second direction perpendicular to the first direction. Each of the second SRAM cells includes a third inverter having a third pull-up GAA transistor coupled to a third pull-down GAA transistor and a fourth inverter having a fourth pull-up GAA transistor coupled to a fourth pull-down GAA transistor. The third and the fourth inverters are cross-coupled to form second data storage nodes. Each of the second SRAM cells further includes third and fourth pass-gate GAA transistors for accessing the second data storage nodes. The array of the second SRAM cells are arranged with a second X-pitch along the first direction and a second Y-pitch along the second direction. Each of the GAA transistors includes a gate electrode wrapping around a stack of semiconductor channels and source/drain regions connected by the semiconductor channels. The source/drain regions of the first and the second pull-up GAA transistors have a higher boron dopant concentration than the source/drain regions of the third and the fourth pull-up GAA transistors. A ratio of the second X-pitch to the first X-pitch is within a range of 1.1 to 1.5.

In an embodiment of the semiconductor structure, the stack of semiconductor channels of the first and the second pull-down GAA transistors have a first channel width, the stack of semiconductor channels of the third and the fourth pull-down GAA transistors have a second channel width, and a ratio of the second channel width to the first channel width is in a range of 1.2 to 5.

In another embodiment, the first Y-pitch and the second Y-pitch are about the same, a ratio of the first X-pitch to the first Y-pitch is greater than 2, and a ratio of the second X-pitch to the second Y-pitch is greater than 2.5.

In an embodiment, the semiconductor structure further includes first power supply lines, first bit lines, and first inverse bit lines disposed in a first metal layer and connected to the array of the first SRAM cells; and second power supply lines, second bit lines, and second inverse bit lines disposed in the first metal layer and are connected to the array of the second SRAM cells, wherein the first bit line and the first inverse bit line have a first width, the second bit line and the second inverse bit line have a second width, and a ratio of the second width to the first width is greater than 1.1.

In an embodiment, the semiconductor structure further includes write-assist circuitry connected to each of the first SRAM cells, wherein the second SRAM cells are not connected to a write-assist circuitry.

In an embodiment of the semiconductor structure, each of the first and the second pull-down GAA transistors and the first and the second pass-gate GAA transistors includes a first gate electrode having a first work-function metal layer, each of the third and the fourth pull-down GAA transistors and the third and the fourth pass-gate GAA transistors includes a second gate electrode having a second work-function metal layer, the first and the second work-function metal layers include titanium nitride (TiN) or tungsten nitride carbon (WN—C), wherein the first work-function metal layer is thicker than the second work-function metal layer.

In another embodiment, each of the first and the second pull-down GAA transistors and the first and the second pass-gate GAA transistors includes a first gate electrode having a first work-function metal layer, each of the first and the second pull-up GAA transistors includes a second gate electrode having a second work-function metal layer, wherein the first and the second work-function metal layers include a same material. In a further embodiment, each of the third and the fourth pull-down GAA transistors and the third and the fourth pass-gate GAA transistors includes a third gate electrode having a third work-function metal layer, each of the third and the fourth pull-up GAA transistors includes a fourth gate electrode having a fourth work-function metal layer, wherein the third and the fourth work-function metal layers include different materials.

In yet another example aspect, the present disclosure is directed to a method that includes providing a structure having a substrate, a high-density SRAM area and a high-current SRAM area defined over the substrate, first gate electrodes engaging first channel semiconductor layers in the high-density SRAM area, and second gate electrodes engaging second channel semiconductor layers in the high-current SRAM area. The method further includes epitaxially growing first source/drain features in the high-density SRAM area and connected to the first channel semiconductor layers; epitaxially growing second source/drain features in the high-current SRAM area and connected to the second channel semiconductor layers; forming an interlayer dielectric layer covering the first and the second source/drain features; replacing the first gate electrodes with first high-k metal gates; replacing the second gate electrodes with second high-k metal gates; forming first contacts over the first source/drain features and electrically connected to the first source/drain features; forming second contacts over the second source/drain features and electrically connected to the second source/drain features; and first doping the first source/drain features with an extra dose of boron than the second source/drain features.

In an embodiment of the method, after the epitaxially growing of the first and the second source/drain features and before the forming of the interlayer dielectric layer, the first doping includes forming a first mask covering the second source/drain features and exposing the first source/drain features; doping the first source/drain features with the extra dose of boron through the first mask; and removing the first mask.

In another embodiment of the method, after the forming of the interlayer dielectric layer and before the forming of the first contacts, the first doping includes etching first contact holes through the interlayer dielectric layer and exposes the first source/drain features and doping the first source/drain features with the extra dose of boron through the first contact holes.

In an embodiment, the method further includes second doping the first and the second source/drain features with a same dose of boron before the forming of the interlayer dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an array of first SRAM cells over the substrate, wherein each of the first SRAM cells includes two first p-type FinFET transistors and four first n-type FinFET transistors, wherein each of the first p-type FinFET transistors and the first n-type FinFET transistors includes a transistor channel in a single semiconductor fin and two source/drain regions connected by the transistor channel, wherein the array of the first SRAM cells are arranged with a first X-pitch along a first direction and a first Y-pitch along a second direction perpendicular to the first direction; and
an array of second SRAM cells over the substrate, wherein each of the second SRAM cells includes two second p-type FinFET transistors and four second n-type FinFET transistors, wherein each of the second p-type FinFET transistors includes a transistor channel in a single semiconductor fin and two source/drain regions connected by the transistor channel, wherein each of the second n-type FinFET transistors includes a transistor channel in multiple semiconductor fins and two source/drain regions connected by the transistor channel, wherein the array of the second SRAM cells are arranged with a second X-pitch along the first direction and a second Y-pitch along the second direction, wherein the source/drain regions of the first p-type FinFET transistors have a higher boron dopant concentration than the source/drain regions of the second p-type FinFET transistors, wherein a ratio of the second X-pitch to the first X-pitch is within a range of 1.1 to 1.5.

2. The semiconductor structure of claim 1, further comprising:
write-assist circuitry connected to each of the first SRAM cells, wherein the second SRAM cells are not connected to a write-assist circuitry.

3. The semiconductor structure of claim 1, further comprising:
first power supply lines, first bit lines, and first inverse bit lines disposed in a first metal layer;
first word lines disposed in a second metal layer over the first metal layer, wherein the first power supply lines, the first bit lines, the first inverse bit lines, and the first word lines are connected to the array of the first SRAM cells;
second power supply lines, second bit lines, and second inverse bit lines disposed in the first metal layer; and
second word lines disposed in the second metal layer, wherein the second power supply lines, the second bit lines, the second inverse bit lines, and the second word lines are connected to the array of the second SRAM cells, wherein the first bit line and the first inverse bit line have a first width, the second bit line and the second inverse bit line have a second width, and a ratio of the second width to the first width is greater than 1.1.

4. The semiconductor structure of claim 3, wherein the first bit line, the first inverse bit line, the second bit line, and the second inverse bit line are routed generally along the second direction, wherein the first word line and the second word line are routed generally along the first direction.

5. The semiconductor structure of claim 1, wherein each of the first n-type FinFET transistors includes a first gate electrode having a first work-function metal layer, each of the second n-type FinFET transistors includes a second gate electrode having a second work-function metal layer, wherein the first and the second work-function metal layers include a same material, wherein the first work-function metal layer is thicker than the second work-function metal layer.

6. The semiconductor structure of claim 1, wherein each of the first n-type FinFET transistors includes a first gate electrode having a first work-function metal layer, each of the first p-type FinFET transistors includes a second gate electrode having a second work-function metal layer, wherein the first and the second work-function metal layers include a same material.

7. The semiconductor structure of claim 6, wherein each of the second n-type FinFET transistors includes a third gate electrode having a third work-function metal layer, each of the second p-type FinFET transistors includes a fourth gate electrode having a fourth work-function metal layer, wherein the third and the fourth work-function metal layers include different materials.

8. The semiconductor structure of claim 1, wherein the first n-type FinFET transistors have a higher threshold voltage than the second n-type FinFET transistors.

9. A semiconductor structure, comprising:
a substrate;
an array of first SRAM cells over the substrate, wherein each of the first SRAM cells includes a first inverter having a first pull-up GAA transistor coupled to a first pull-down GAA transistor and a second inverter having a second pull-up GAA transistor coupled to a second pull-down GAA transistor, the first and the second inverters are cross-coupled to form first data storage nodes, each of the first SRAM cells further includes first and second pass-gate GAA transistors for accessing the first data storage nodes, wherein the array of the first SRAM cells are arranged with a first X-pitch along a first direction and a first Y-pitch along a second direction perpendicular to the first direction; and
an array of second SRAM cells over the substrate, wherein each of the second SRAM cells includes a third inverter having a third pull-up GAA transistor coupled to a third pull-down GAA transistor and a fourth inverter having a fourth pull-up GAA transistor coupled to a fourth pull-down GAA transistor, the third and the fourth inverters are cross-coupled to form second data storage nodes, each of the second SRAM cells further includes third and fourth pass-gate GAA transistors for accessing the second data storage nodes, wherein the array of the second SRAM cells are arranged with a second X-pitch along the first direction and a second Y-pitch along the second direction,
wherein each of the GAA transistors includes a gate electrode wrapping around a stack of semiconductor channels and source/drain regions connected by the semiconductor channels, wherein the source/drain regions of the first and the second pull-up GAA transistors have a higher boron dopant concentration than the source/drain regions of the third and the fourth pull-up GAA transistors, wherein a ratio of the second X-pitch to the first X-pitch is within a range of 1.1 to 1.5.

10. The semiconductor structure of claim 9, wherein the stack of semiconductor channels of the first and the second pull-down GAA transistors have a first channel width, the stack of semiconductor channels of the third and the fourth pull-down GAA transistors have a second channel width, and a ratio of the second channel width to the first channel width is in a range of 1.2 to 5.

11. The semiconductor structure of claim 9, wherein the first Y-pitch and the second Y-pitch are about the same, a ratio of the first X-pitch to the first Y-pitch is greater than 2, and a ratio of the second X-pitch to the second Y-pitch is greater than 2.5.

12. The semiconductor structure of claim 9, further comprising:
first power supply lines, first bit lines, and first inverse bit lines disposed in a first metal layer and connected to the array of the first SRAM cells; and
second power supply lines, second bit lines, and second inverse bit lines disposed in the first metal layer and are connected to the array of the second SRAM cells, wherein the first bit line and the first inverse bit line have a first width, the second bit line and the second inverse bit line have a second width, and a ratio of the second width to the first width is greater than 1.1.

13. The semiconductor structure of claim 9, further comprising:
write-assist circuitry connected to each of the first SRAM cells, wherein the second SRAM cells are not connected to a write-assist circuitry.

14. The semiconductor structure of claim 9, wherein each of the first and the second pull-down GAA transistors and the first and the second pass-gate GAA transistors includes a first gate electrode having a first work-function metal layer, each of the third and the fourth pull-down GAA transistors and the third and the fourth pass-gate GAA transistors includes a second gate electrode having a second work-function metal layer, the first and the second work-function metal layers include titanium nitride (TiN) or tungsten nitride carbon (WN—C), wherein the first work-function metal layer is thicker than the second work-function metal layer.

15. The semiconductor structure of claim 9, wherein each of the first and the second pull-down GAA transistors and the first and the second pass-gate GAA transistors includes a first gate electrode having a first work-function metal layer, each of the first and the second pull-up GAA transistors includes a second gate electrode having a second work-function metal layer, wherein the first and the second work-function metal layers include a same material.

16. The semiconductor structure of claim 15, each of the third and the fourth pull-down GAA transistors and the third and the fourth pass-gate GAA transistors includes a third gate electrode having a third work-function metal layer, each of the third and the fourth pull-up GAA transistors includes a fourth gate electrode having a fourth work-function metal layer, wherein the third and the fourth work-function metal layers include different materials.

17. A method, comprising:
providing a structure having a substrate, a high-density SRAM area and a high-current SRAM area defined over the substrate, first gate electrodes engaging first channel semiconductor layers in the high-density SRAM area, and second gate electrodes engaging second channel semiconductor layers in the high-current SRAM area;
epitaxially growing first source/drain features in the high-density SRAM area and connected to the first channel semiconductor layers;
epitaxially growing second source/drain features in the high-current SRAM area and connected to the second channel semiconductor layers;
forming an interlayer dielectric layer covering the first and the second source/drain features;
replacing the first gate electrodes with first high-k metal gates;
replacing the second gate electrodes with second high-k metal gates;
forming first contacts over the first source/drain features and electrically connected to the first source/drain features;
forming second contacts over the second source/drain features and electrically connected to the second source/drain features; and
first doping the first source/drain features with an extra dose of boron than the second source/drain features.

18. The method of claim 17, wherein the first doping includes, after the epitaxially growing of the first and the second source/drain features and before the forming of the interlayer dielectric layer:
forming a first mask covering the second source/drain features and exposing the first source/drain features;
doping the first source/drain features with the extra dose of boron through the first mask; and
removing the first mask.

19. The method of claim 17, wherein the first doping includes, after the forming of the interlayer dielectric layer and before the forming of the first contacts:
etching first contact holes through the interlayer dielectric layer and exposes the first source/drain features; and
doping the first source/drain features with the extra dose of boron through the first contact holes.

20. The method of claim 17, further comprising:
second doping the first and the second source/drain features with a same dose of boron before the forming of the interlayer dielectric layer.

* * * * *